US012804878B2

(12) United States Patent
Brown et al.

(10) Patent No.: US 12,804,878 B2
(45) Date of Patent: Nov. 17, 2026

(54) APPARATUS COMPRISING CRYSTALLINE SEMICONDUCTOR MATERIALS AND METAL SILICIDE MATERIALS, AND RELATED METHODS AND SYSTEMS

(71) Applicant: Micron Technology, Inc., Boise, ID (US)

(72) Inventors: Jay S. Brown, Boise, ID (US); Protyush Sahu, Boise, ID (US); Shuai Jia, Boise, ID (US); Jeffery B. Hull, Boise, ID (US); Silvia Borsari, Boise, ID (US); Li Wei Fang, Boise, ID (US); Vivek Y. Yadav, Boise, ID (US); Jaidah Mohan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 357 days.

(21) Appl. No.: 18/427,740

(22) Filed: Jan. 30, 2024

(65) Prior Publication Data

US 2024/0334676 A1 Oct. 3, 2024

Related U.S. Application Data

(60) Provisional application No. 63/493,157, filed on Mar. 30, 2023.

(51) Int. Cl.

| | |
|---|---|
| ***H10B 12/00*** | (2023.01) |
| ***H10P 14/20*** | (2026.01) |
| ***H10W 20/00*** | (2026.01) |

(52) U.S. Cl.

CPC ......... *H10B 12/30* (2023.02); *H10B 12/0335* (2023.02); *H10B 12/315* (2023.02);

(Continued)

(58) Field of Classification Search

CPC .. H10B 12/30; H10B 12/0335; H10B 12/315; H10B 12/482; H10P 14/3454; H10P 14/3458; H10P 14/3466; H10W 20/069

See application file for complete search history.

(56) References Cited

U.S. PATENT DOCUMENTS

| | | | |
|---|---|---|---|
| 6,140,675 | A | 10/2000 | Sugiura et al. |
| 6,309,975 | B1 | 10/2001 | Wu et al. |

(Continued)

FOREIGN PATENT DOCUMENTS

| | | |
|---|---|---|
| WO | 2005/065385 A2 | 7/2005 |

OTHER PUBLICATIONS

Yu et al., "Titanium Silicide on Si:P With Precontact Amorphization Implantation Treatment: Contact Resistivity Approaching 1x10-9 Ohm-cm2", IEEE Transactions on Electron Devices, vol. 63, No. 12, Dec. 2016, 10 pages.

*Primary Examiner* — David Vu
*Assistant Examiner* — Brandon C Fox
(74) *Attorney, Agent, or Firm* — TraskBritt

(57) ABSTRACT

An apparatus comprises a memory array comprising access lines, digit lines, and memory cells. Each memory cell is coupled to an associated access line and an associated digit line and each memory cell comprises an access device, and a monocrystalline semiconductor material adjacent to the access device. A width of the monocrystalline semiconductor material is within a range of from about 8 nm to about 25 nm. Each memory cell comprises a metal silicide material over the monocrystalline semiconductor material, a metal contact material over the metal silicide material, and a storage node adjacent to the metal contact material. Methods of forming an apparatus and systems are also disclosed.

20 Claims, 16 Drawing Sheets

(52) U.S. Cl.
CPC ....... *H10B 12/482* (2023.02); *H10P 14/3454* (2026.01); *H10P 14/3458* (2026.01); *H10P 14/3466* (2026.01); *H10W 20/069* (2026.01)

(56) References Cited

U.S. PATENT DOCUMENTS

| | | | |
|---|---|---|---|
| 8,212,259 | B2 | 7/2012 | Flynn et al. |
| 8,304,819 | B2 | 11/2012 | Jung |
| 8,709,921 | B2 | 4/2014 | Su |
| 8,796,085 | B2 | 8/2014 | Koldiaev et al. |
| 8,940,595 | B2 | 1/2015 | Chandra et al. |
| 9,218,964 | B2 | 12/2015 | Wang et al. |
| 9,446,949 | B2 | 9/2016 | Pokroy et al. |
| 9,449,848 | B2 | 9/2016 | Miyano et al. |
| 9,929,249 | B1 | 3/2018 | Ahn et al. |
| 10,522,362 | B2 | 12/2019 | Kim et al. |
| 10,658,367 | B1 | 5/2020 | Simsek-Ege |
| 11,152,371 | B2 | 10/2021 | Iwaki |
| 11,322,502 | B2 | 5/2022 | Kim et al. |
| 12,588,191 | B2 * | 3/2026 | Zhang ................ H10B 12/0335 |
| 2005/0208687 | A1 | 9/2005 | Kasai et al. |
| 2008/0185030 | A1 | 8/2008 | Pierce et al. |
| 2019/0109234 | A1 | 4/2019 | Glass et al. |
| 2023/0022071 | A1 * | 1/2023 | Yao ...................... H10B 12/485 |
| 2024/0332015 | A1 * | 10/2024 | Sahu ...................... H10B 12/02 |

* cited by examiner

A

B

C

APPARATUS COMPRISING CRYSTALLINE SEMICONDUCTOR MATERIALS AND METAL SILICIDE MATERIALS, AND RELATED METHODS AND SYSTEMS

CROSS-REFERENCE TO RELATED APPLICATIONS

This application claims the benefit under 35 U.S.C. § 119 (e) of U.S. Provisional Patent Application Ser. No. 63/493,157, filed Mar. 30, 2023, the subject matter of which is related to the subject matter of U.S. Application No. 63/493,165, titled "METHODS OF FORMING APPARATUS COMPRISING CRYSTALLINE SEMICONDUCTOR MATERIALS AND METAL SILICIDE MATERIALS, AND RELATED APPARATUS," filed on even date herewith, the disclosure of each of which is hereby incorporated herein in its entirety by this reference.

TECHNICAL FIELD

Embodiments disclosed herein relate to apparatus (e.g., electronic devices) and to fabrication of the apparatus. More particularly, embodiments of the disclosure relate to apparatus including crystalline semiconductor (e.g., monocrystalline silicon) materials and metal silicide materials, and related methods and systems.

BACKGROUND

Electronic device designers desire to increase the level of integration or density of features within an electronic device by reducing the dimensions of individual features and by reducing the separation distance between neighboring features. In addition, electronic device designers often desire to design architectures that are not only compact, but offer performance advantages, as well as simplified designs. A relatively common electronic device is a memory device. A memory device may include a memory array having a number of memory cells arranged in a grid pattern. One type of memory cell is a dynamic random access memory (DRAM) device, which is a volatile memory device that may lose a stored state over time unless the DRAM device is periodically refreshed by an external power supply. In the simplest design configuration, a DRAM cell includes one access device (e.g., a transistor) and one storage device (e.g., a capacitor). Modern applications for memory devices may utilize vast numbers of DRAM unit cells, arranged in an array of rows and columns. The DRAM cells are electrically accessible through digit lines and access lines (e.g., word lines) arranged along the rows and columns of the array.

As the dimensions and spacing of the features decrease, contact resistance of the features increases due to the smaller feature sizes. To form contacts in conventional electronic devices, openings (e.g., contact holes) are formed that extend to active areas of the electronic device. Epitaxial growth of silicon is conducted in the openings and over the active areas, forming monocrystalline silicon, and an amorphous silicon interface is formed over the monocrystalline silicon using an implant process. The monocrystalline silicon and the amorphous silicon interface are doped with phosphorus. A metal silicide is then formed adjacent to the amorphous silicon interface. However, the epitaxial growth of the monocrystalline silicon is a self-limiting process within constrained regions (e.g., reduced dimensions) of the openings. Further, using the implant process to form the amorphous silicon interface contributes to the increased contact resistance in these conventional electronic devices.

DETAILED DESCRIPTION

Figure 1:
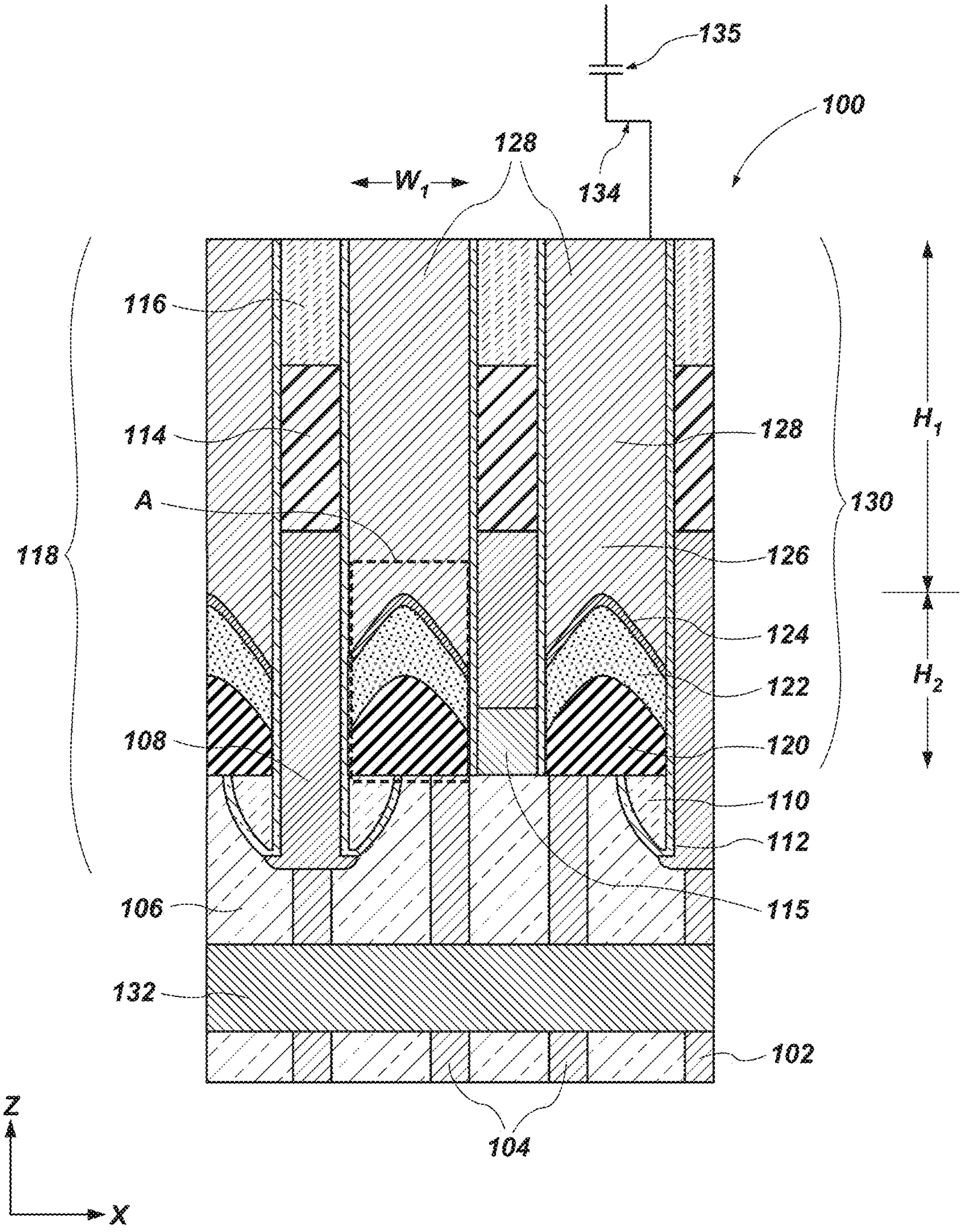
FIG. 1 is a simplified, partial cross-sectional view of an apparatus including contact structures according to embodiments of the disclosure.

An apparatus (e.g., an electronic device, a semiconductor device, a memory device) is disclosed that includes access lines (e.g., word lines), digit lines (bit lines, data lines), and memory cells. Each of the memory cells is coupled to an associated access line and an associated digit line. The apparatus includes an access device, and a monocrystalline semiconductor material (e.g., a monocrystalline silicon material) adjacent to (e.g., selectively epitaxially grown on) the access device (e.g., active areas thereof), a metal silicide adjacent to (e.g., over) the monocrystalline semiconductor material, a metal material (e.g., metal contact material) adjacent to (e.g., over) the metal silicide material, and a storage node adjacent to the metal material. The monocrystalline semiconductor material may be a monocrystalline silicon material. In embodiments of the disclosure, a crystalline material (e.g., nanocrystalline material, semi-crystalline material) may be formed over the monocrystalline semiconductor material. The crystalline material may be converted to an amorphous material (e.g., an amorphous silicon material). Portions of the amorphous material may, optionally, remain between the monocrystalline semiconductor material and the metal silicide. The metal silicide (e.g., titanium silicide, tungsten silicide) is a material that includes a silicide of the amorphous material and the metal material.

The monocrystalline semiconductor material, the amorphous material, if present, the metal silicide, and the metal material constitute a contact structure between an access device (e.g., a transistor) positioned adjacent to (e.g., below) the active areas and a storage device (e.g., storage node, a capacitor) over the metal material. In some embodiments, the nanocrystalline material comprises localized regions including one or more of amorphous regions and defect regions within boundaries of the nanocrystalline material, with a concentration of a dopant (e.g., an n-type dopant) substantially homogenous throughout the nanocrystalline material. Diffusion of the dopant within the nanocrystalline material including the localized regions may allow increased concentration of the dopant, as well as allowing the dopant to diffuse homogeneously throughout the nanocrystalline material.

To form the contact structure, the monocrystalline semiconductor material is formed by an epitaxial growth process, and the crystalline material is formed during the epitaxial growth process by adjusting (e.g., tuning, tailoring) process conditions to form an epitaxial plug (e.g., a doped epitaxial plug, such as a phosphorus doped epitaxial plug). The amorphous material may, optionally, be formed by an implant (Pre-Amorphization Implant (PAI)) process. A portion of the amorphous material is converted to the metal silicide. The metal material (e.g., titanium, tungsten) is over the metal silicide. The monocrystalline semiconductor material and the crystalline material may be formed by a single, substantially continuous process in which the process conditions are varied. By varying the process conditions during the single, substantially continuous process, manufacturing processes may be simplified and costs may be reduced.

By forming the crystalline material directly over (e.g., in direct contact with) the monocrystalline semiconductor material, the memory cells according to embodiments of the disclosure exhibit reduced contact resistance relative to contact structures of conventional memory cells. Formation of the crystalline material increases a thickness (e.g., height) of the epitaxial plug relative to that produced by formation of the monocrystalline semiconductor material (e.g., alone) in conventional contact structures. Therefore, the thickness of the epitaxial plug according to embodiments of the disclosure may be increased and electroresistivity of the contact structures may be lower. In some embodiments, the amorphous material may be formed adjacent to (e.g., directly over) the monocrystalline semiconductor material to increase a thickness of the epitaxial plug, without forming the crystalline material and without performing the implant process. By forming the amorphous material directly over the monocrystalline semiconductor material, damage to the contact structures may be reduced and electroresistivity of the contact structures may be lower. In additional embodiments, an upper surface of the monocrystalline semiconductor material may be sloped (e.g., inclined). The sloped upper surface of the monocrystalline semiconductor material may provide additional surface area for formation of additional monocrystalline semiconductor material of the epitaxial plug.

The following description provides specific details, such as material types, material thicknesses, and process conditions in order to provide a thorough description of embodiments described herein. However, a person of ordinary skill in the art would understand that the embodiments of the disclosure may be practiced without employing these specific details. Indeed, the embodiments of the disclosure may be practiced in conjunction with conventional apparatus fabrication techniques employed in the industry. In addition, the description provided below does not form a complete process flow for manufacturing an apparatus (e.g., an electronic device, a microelectronic device, a memory device, such as DRAM memory device). The structures described below do not form a complete apparatus. Only those process acts and structures necessary to understand the embodiments of the disclosure are described in detail below. Additional acts to form a complete apparatus from the structures may be performed by conventional fabrication techniques.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "contact" means and includes a connection facilitating a conductive pathway between at least two structures of the apparatus. For example, in a DRAM device exhibiting a dual bit memory cell structure, a digit line contact is provided between a digit line and an access device (e.g., a transistor) formed in or above a substrate, and a storage device contact is formed between the access device and the storage device (e.g., a capacitor) where electrical charge may be stored.

As used herein, the term "contact structure" means and includes a connection structure including the monocrystalline semiconductor material, the metal silicide, and the metal material between the access device and the storage device.

As used herein, the term "epitaxial growth" means and includes a material formed by a growth process in which the to-be-formed material has a crystal orientation (e.g., a crystal form, a crystal state) substantially similar to the crystal orientation of the material on which it is formed.

An apparatus 100 including a base material 102 (e.g., a substrate), active areas 104, shallow trench isolation (STI) structures 106, digit contacts 108, diffusion regions 110, insulative spacer material 112, digit lines 114, etch stop material 115, one or more insulative cap materials 116, monocrystalline semiconductor material 120 (e.g., monocrystalline silicon material, epitaxial silicon material), metal silicide 122, barrier material 124, and metal material 126 of cell contacts 128 (e.g., storage node contacts) is shown in FIG. 1, which is a cross-sectional view of the apparatus 100 in a first horizontal direction (e.g., a digit line direction). For convenience in describing FIG. 1, the first horizontal direction may be defined as the X-direction and a second horizontal direction, which is transverse (e.g., perpendicular) to the first horizontal direction. A third direction, which is transverse (e.g., perpendicular) to each of the first horizontal direction and the second horizontal direction, may be defined as the Z-direction. Similar directions are defined, as shown in FIGS. 2A through 5D, as described in greater detail below.

Digit line structures 118 include the digit lines 114 and the materials (e.g., the digit contacts 108, the insulative cap material 116) vertically adjacent to the digit lines 114. The monocrystalline semiconductor material 120 is on (e.g., directly on, directly contacts) the active areas 104 and the STI structures 106, as shown in FIG. 1. The monocrystalline semiconductor material 120 exhibits a monocrystalline orientation. The metal silicide 122 is adjacent to (e.g., on or over) the monocrystalline semiconductor material 120, the barrier material 124 is on (e.g., directly on, directly contacts) the metal silicide 122, and the cell contact 128 is on (e.g., directly on, directly contacts) the barrier material 124. The monocrystalline semiconductor material 120, the metal silicide 122, the barrier material 124, and the cell contacts 128 constitute contact structures 130 and separate adjacent digit line structures 118 including the digit lines 114 from one another in the first horizontal direction (e.g., the digit line direction). In the second horizontal direction (e.g., an access line direction), the contact structures 130 (e.g., the monocrystalline semiconductor material 120, the metal silicide 122, the barrier material 124, and the cell contacts 128) are positioned over the STI structures 106.

The apparatus 100 also includes access lines 132 (e.g., word lines). The access lines 132 may be formed of and include an electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively doped semiconductor material (e.g., conductively doped silicon, conductively doped germanium, conductively doped silicon germanium). By way of non-limiting example, the access lines 132 may individually comprise one or more of W, TiN, TaN, WN, TiAlN, Ti, Pt, Rh, Ir, $IrO_x$, Ru, $RuO_x$, and alloys thereof. In some embodiments, the access lines 132 are formed of tungsten. The access lines 132 are isolated from one another by the STI structures 106.

As shown in FIG. 1, redistribution material (RDM) structures 134 (also referred to as "redistribution layer (RDL) structures") may be formed on or over the cell contacts 128, and storage node structures 135 may be in electrical communication with the RDM structures 134 and the cell contacts 128. The RDM structures 134 may be configured to effectively shift (e.g., stagger, adjust, modify) lateral positions (e.g., in the X-direction, in a second horizontal direction, transverse to the X-direction) of the cell contacts 128 to accommodate a desired arrangement (e.g., a hexagonal close packed arrangement) of the storage node structures 135 over and in electrical communication with the cell contacts 128. The RDM structures 134 may be formed of and include one or more of the previously mentioned electrically conductive materials. The RDM structures 134 may be configured and formulated to couple (e.g., physically couple, electrically couple) the cell contacts 128 of the contact structures 130 to the storage node structures 135. The storage node structures 135 may be configured to store a charge representative of a programmable logic state. For example, a charged state of the storage node structures 135 may represent a first logic state (e.g., a logic 1), and an uncharged state of the storage node structures 135 may represent a second logic state (e.g., a logic 0). By way of example only, the cell contacts 128 may correspond to a landing pad for the storage node structures 135, such as a capacitor. For convenience, only one of the contact structures 130 is illustrated as including the RDM structure 134 and the storage node structure 135 in FIG. 1, although it is understood that each of the contact structures 130 may include the RDM structure 134 and the storage node structure 135.

Openings (e.g., contact openings) are defined by sidewalls (e.g., substantially straight, vertical sidewalls without voids or spaces) of the insulative spacer material 112. A width $W_1$ of the openings between adjacent portions of the insulative spacer material 112 of the digit line structures 118 may be within a range of from about 4 nm to about 25 nm, such as from about 4 nm to about 6 nm, from about 6 nm to about 8 nm, from about 8 nm to about 10 nm, from about 10 nm to about 15 nm, from about 15 nm to about 20 nm, or from about 20 nm to about 25 nm. In some embodiments, the width $W_1$ may be equal to or less than about 25 nm (e.g., about 10 nm, about 8 nm). The width $W_1$ may be selected and tailored to effect a size and shape of one or more features (e.g., the cell contacts 128) of the apparatus 100. However, the disclosure is not so limited and the width $W_1$ may be different than those described above.

The cell contacts 128 of the contact structures 130 may individually exhibit a first height $H_1$, and a combination of the monocrystalline semiconductor material 120, the metal silicide 122, and the barrier material 124 (e.g., defining an epitaxial plug) of the contact structures 130 may exhibit a second height $H_2$ that is relatively less than the first height $H_1$ of the cell contacts 128. The first height $H_1$ of the cell contacts 128 is greater than or equal to a combined thickness of additional materials of the contact structures 130 underlying the cell contacts 128. Accordingly, the first height $H_1$ corresponds to the vertical thickness of the cell contacts 128 and is relatively greater than the second height $H_2$ of the monocrystalline semiconductor material 120, the metal silicide 122, the barrier material 124, and additional materials adjacent thereto. The first height $H_1$ of the cell contacts 128 may be within a range of from about 15 nm to about 200 nm, such as from about 15 nm to about 40 nm, from about 40 nm to about 80 nm, from about 80 nm to about 120 nm, from about 120 nm to about 160 nm, or from about 160 nm to about 200 nm. The second height $H_2$ of the materials of the contact structures 130 underlying the cell contacts 128 may be within a range of from about 10 nm to about 65 nm, such as from about 10 nm to about 20 nm, from about 20 nm to about 30 nm, from about 30 nm to about 40 nm, from about 40 nm to about 50 nm, or from about 50 nm to about 65 nm. In some embodiments, the second height $H_2$ is equal to or greater than about 15 nm. Further, the second height $H_2$ may be about three times (3×) greater than a height of conventional materials of conventional apparatus. However, the disclosure is not so limited and the first height $H_1$ and the second height $H_2$ may be different than those described above.

FIGS. 2A through 2E are simplified, partial cross-sectional views illustrating embodiments of forming the apparatus 100 (e.g., an electronic device, a memory device, such as a DRAM device) including the contact structures 130 (FIG. 1). FIGS. 2A through 2E illustrate an enlarged portion of box A of FIG. 1. FIGS. 2F and 2G are micrographs of the contact structures 130. With the description provided below, it will be apparent to one of ordinary skill in the art that the methods described herein may be used in the fabrication of various electronic devices and not only DRAM devices.

Figure 2A:
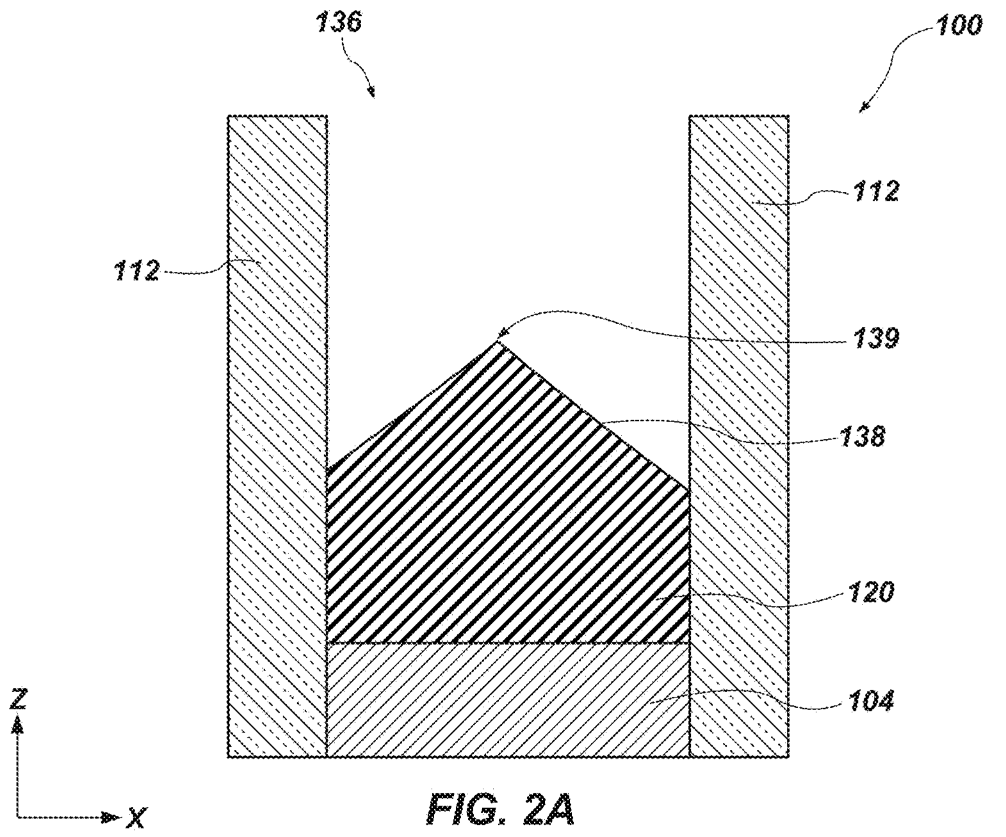
FIGS. 2A through 2E are simplified, partial cross-sectional views illustrating a method of forming the apparatus according to embodiments of the disclosure.

As shown in FIG. 2A, the active areas 104 are formed in the base material 102 (FIG. 1) that has been subjected to previous fabrication acts to form features thereon or therein. The base material 102 may include a conventional silicon substrate (e.g., a conventional silicon wafer), or another bulk substrate comprising a semiconductive material. In some embodiments, the base material 102 includes different materials, structures, devices, and/or regions formed thereon and/or therein. In some embodiments, the base material 102 includes complementary metal-oxide-semiconductor (CMOS) circuitry and devices configured for effectuating operation of memory cells of the apparatus 100. The active areas 104 are formed from monocrystalline silicon, such as doped monocrystalline silicon, and may be isolated from one another by the STI structures 106 (FIG. 1), which are formed from silicon dioxide ($SiO_2$). By way of example only, the active areas 104 may be formed of n-doped silicon.

Prior to forming the contact structures 130 (FIG. 1), the digit line structures 118 (FIG. 1) may be formed adjacent to (e.g., over) exposed portions of the active areas 104. The digit line structures 118 include the insulative spacer material 112 laterally adjacent to the digit contacts 108 (FIG. 1), the digit lines 114 (FIG. 1), and the insulative cap material 116 (FIG. 1). The digit lines 114 may be formed of and include one or more of the previously mentioned electrically conductive materials. The digit line structures 118 may also include additional vertically adjacent materials, such as a barrier metal material between the digit contacts 108 and the digit lines 114, as well as additional materials and structures (e.g., digit line caps) adjacent to (e.g., over) the insulative cap material 116. The materials and structures of the digit line structures 118 are formed by conventional techniques.

Additional portions of the active areas 104 are laterally separated from the active areas 104 underlying the digit line structures 118 (FIG. 1) by the insulative spacer material 112. The insulative spacer material 112 may be formed of and include an insulative material such as, for example, one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative spacer material 112 comprises $SiO_2$.

The monocrystalline semiconductor material 120 (e.g., epitaxial silicon) may be formed over the STI structures 106 (FIG. 1) and the active areas 104. The monocrystalline semiconductor material 120 is formed over the active areas 104 and between the insulative spacer material 112 of the digit line structures 118 (FIG. 1). For example, openings 136 (e.g., contact openings, contact holes) may be formed between laterally adjacent portions of the insulative spacer material 112, and the monocrystalline semiconductor material 120 may be formed within the openings 136, as shown in FIG. 2A. The openings 136 are defined by sidewalls of the insulative spacer material 112, an upper surface of the active areas 104, and an upper surface of the STI structures 106 (FIG. 1). The openings 136 extend to the active areas 104 and the STI structures 106 in the first horizontal direction (e.g., the X-direction).

Forming (e.g., epitaxially growing) the silicon of the monocrystalline semiconductor material 120 adjacent to (e.g., over) the active areas 104 enables the silicon to be formed in the monocrystalline (e.g., single crystal) orientation. The silicon of the active areas 104 functions as a seed material to orient the crystal form of the monocrystalline semiconductor material 120. The monocrystalline semiconductor material 120 is formed on one or more (e.g., two) of the diffusion regions 110 (FIG. 1). In some embodiments, the diffusion regions 110 are formed from monocrystalline silicon. The monocrystalline semiconductor material 120 may be formed to exhibit an upper boundary 138 (e.g., an upper surface). Formation of the monocrystalline semiconductor material 120 may result in formation of an abrupt transition 139 (e.g., a point, a tip) of the upper boundary 138 thereof. The abrupt transition 139 may be centrally located (e.g., in the X-direction) within the openings 136.

Figure 2B:
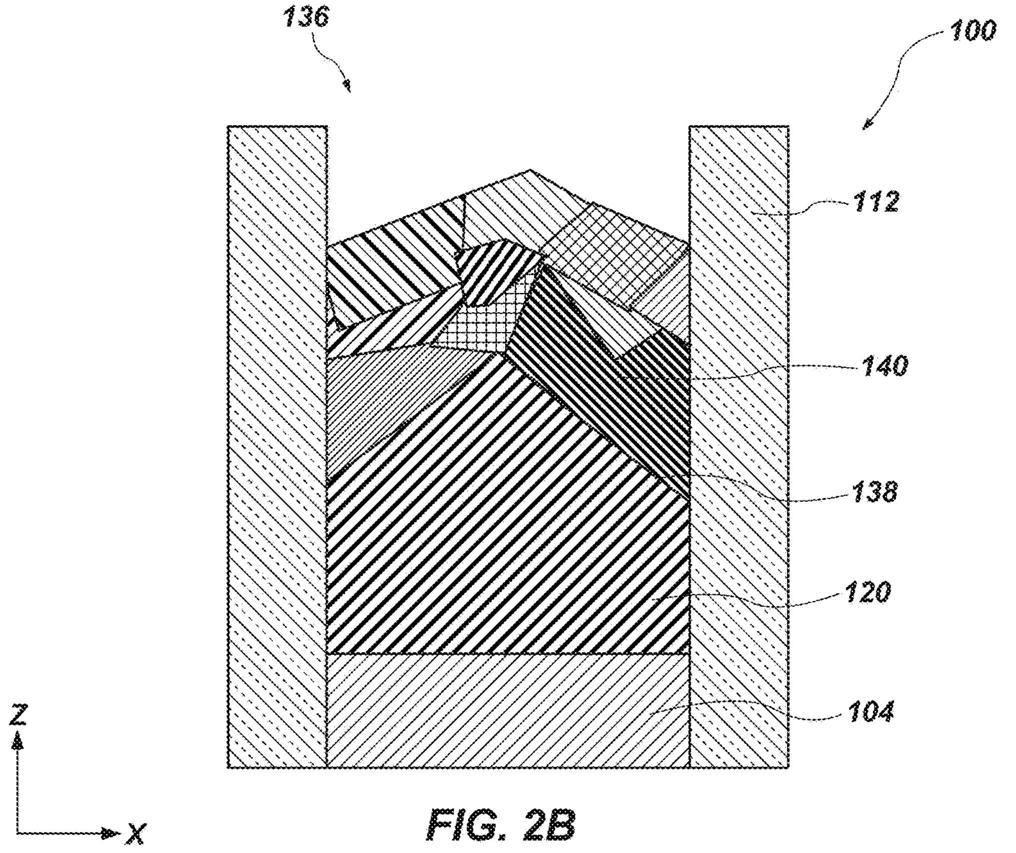

Referring to FIG. 2B, a crystalline material 140 (e.g., an additional crystalline material, a crystalline silicon material) may be formed over the monocrystalline semiconductor material 120 (e.g., over the upper boundary 138 thereof). For clarity and ease of understanding the drawings and associated descriptions, the crystalline material 140 of FIG. 2B includes multiple crosshatchings to illustrate multi-directional crystal orientations within the crystalline material 140. For example, the crystalline material 140 may include one or more of a nanocrystalline material and a semi-crystalline material. The monocrystalline semiconductor material 120 and the crystalline material 140 may be doped, such as with an n-type dopant. The monocrystalline semiconductor material 120 and the crystalline material 140 may, for example, be implanted with phosphorus atoms (e.g., P-doped monocrystalline semiconductor material 120, P-doped crystalline material 140) or other dopant atoms. The doping of the monocrystalline semiconductor material 120 and the crystalline material 140 may be conducted by conventional techniques. In some embodiments, the monocrystalline semiconductor material 120 is P-doped monocrystalline semiconductor material 120 and the crystalline material 140 is P-doped crystalline material 140. The crystalline material 140 may include a different (e.g., greater than) dopant concentration than a dopant concentration of the monocrystalline semiconductor material 120.

The silicon of the monocrystalline semiconductor material 120 functions as a seed material to orient one or more additional crystal forms of the crystalline material 140, indicated by the multiple crosshatchings used for the crystalline material 140. Formation of the nanocrystalline material of the crystalline material 140 may include using natural formation of one or more of so-called “twin plane defects” (e.g., planar defects) and so-called “stacking faults” (e.g., errors occurring in sequences of layers of atoms in crystalline materials) to transition to nanocrystalline growth. The nanocrystalline material may include one or more of single-phase and multiphase nano-sized crystals. The nanocrystalline material may be substantially devoid of polycrystalline material. The semi-crystalline material of the crystalline material 140 may include regions of crystalline material embedded within an amorphous material. For example, the semi-crystalline material may include one or more localized regions of nanocrystalline material, polycrystalline material, and single crystals. The crystalline material 140 may include a highly disordered crystalline material including low growth rate facets. A crystal orientation of the crystalline material 140 may differ from a crystal orientation of the monocrystalline semiconductor material 120. In some embodiments, the monocrystalline semiconductor material 120 exhibits a (100) silicon crystal orientation and the crystalline material 140 (e.g., nanocrystalline silicon material) exhibits a (111) silicon crystal orientation (e.g., inclined facets).

The monocrystalline semiconductor material 120 and the crystalline material 140 are formed in the openings 136 by an epitaxial growth process and substantially completely fill lower portions of the openings 136, without being formed in upper portions thereof. The monocrystalline semiconductor material 120 and the crystalline material 140 may be formed in the openings 136 without substantially removing portions of the insulative spacer material 112. Accordingly, the insulative spacer material 112 includes substantially straight, vertical sidewalls, without voids or spaces (e.g., gaps). The monocrystalline semiconductor material 120 and the crystalline material 140 are formed by a single, substantially continuous process in which the process conditions are varied (e.g., changed) such that the process conditions do not remain constant as both the monocrystalline semiconductor material 120 and the crystalline material 140 are formed. Without being bound by any theory, the substantially continuous process with varying conditions may enable the monocrystalline semiconductor material 120 and the crystalline material 140 to be formed without forming native oxides on the monocrystalline semiconductor material 120.

The substantially continuous, epitaxial growth process may include, for example, removing native oxides (if present) on the surface of the active areas 104 and flowing a silicon precursor, such as silane ($SiH_4$) gas, in the openings 136 at an initial temperature of about 470° C. and an initial pressure of about 1.2 Torr to form the monocrystalline semiconductor material 120, although other process conditions may be contemplated. Thereafter, one or more of the process conditions may be varied to form the crystalline material 140. For example, one or more of temperature, pressure, dopant concentration, dopant species, precursors, and gas flow rates of the silicon precursor may be varied as appropriate for formation of the crystalline material 140 over the monocrystalline semiconductor material 120. As a non-limiting example, the silicon precursor may comprise silicon atoms and at least one ligand comprising one or more of hydrogen, nitrogen, and carbon, such as analkylamido silane compound. The silicon precursor may include, but is not limited to, silane ($SiH_4$), disilane (DiSi), dichlorosilane (DCS), tris(dimethylamido) silane (TDMAS), or combinations thereof. In some embodiments, the silicon precursor is DCS. Therefore, both monocrystalline (e.g., single crystal) and additional crystalline (e.g., nanocrystalline and/or semi-crystalline) forms of silicon are formed in the openings 136 by a single, substantially continuous process. The monocrystalline semiconductor material 120 is formed initially in the openings 136 and the crystalline material 140 is subsequently formed over (e.g., directly on) the monocrystalline semiconductor material 120. Each of the monocrystalline semiconductor material 120 and the crystalline material 140 may be subsequently doped.

Without being bound by any theory, it is believed that the epitaxial growth of the monocrystalline semiconductor material 120 over the active areas 104 and STI structures 106 (FIG. 1) occurs due to the crystal orientation of the silicon of the active areas 104. The crystal orientation of the active areas 104 affects the crystal orientation of the subsequently formed monocrystalline semiconductor material 120. As the epitaxial growth of the monocrystalline semiconductor material 120 proceeds towards and up the sidewalls of the insulative spacer material 112 (defining the openings 136) and as the process conditions are varied, an initial crystal orientation of the silicon changes to an additional crystal orientation of the silicon including one or more of the nanocrystalline material and the semi-crystalline material of the crystalline material 140. Accordingly, the formation of the monocrystalline semiconductor material 120 stops and changes (e.g., transitions) to formation of the crystalline material 140.

A location at which the monocrystalline semiconductor material 120 changes to the crystalline material 140 may be controlled by adjusting one or more of the process conditions upon formation of the monocrystalline semiconductor material 120. Therefore, the monocrystalline semiconductor material 120 is formed in the openings 136 to an initial thickness (e.g., height) by the epitaxial growth process and the crystalline material 140 is formed adjacent to (e.g., over) the monocrystalline semiconductor material 120 by the epitaxial growth process (e.g., a single, continuous process). For example, the crystalline material 140 may be formed directly over the monocrystalline semiconductor material 120 along the upper boundary 138 thereof. The initial thickness of the monocrystalline semiconductor material 120 may be controlled by adjusting the process conditions in which the monocrystalline semiconductor material 120 is formed, and the initial thickness of the crystalline material 140 may be controlled by adjusting the process conditions in which the crystalline material 140 is formed. By way of non-limiting example, the monocrystalline semiconductor material 120 may be formed in the openings 136 at a thickness of from about 5 nm to about 30 nm and the crystalline material 140 may be formed at a thickness of from about 10 nm to about 35 nm for a combined thickness of from about 15 nm to about 65 nm. However, the disclosure is not so limited and the thickness of the monocrystalline semiconductor material 120 within the openings 136 may be different than those described above.

Figure 2C:
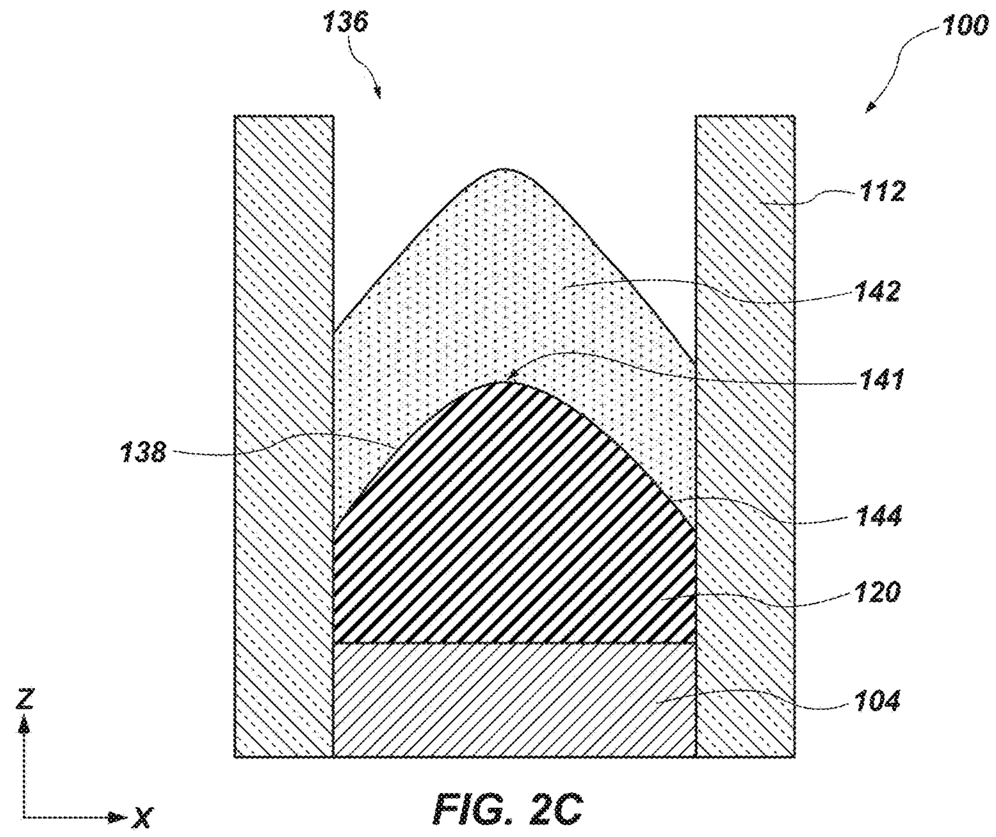

As shown in FIG. 2C, at least a portion of the crystalline material 140 (FIG. 2B) may be converted to an amorphous material 142 (e.g., an amorphous silicon material). The amorphous material 142 may, optionally, be formed by an implant (Pre-Amorphization Implant (PAI)) process. In some embodiments, portions (e.g., upper portions) of the crystalline material 140 may be converted to the amorphous material 142 and additional portions (e.g., lower portions) of the crystalline material 140 may remain in the apparatus 100. Alternatively, and as shown in the perspective of FIG. 2C, the crystalline material 140 (e.g., a sacrificial material) may be substantially completely converted to the amorphous material 142 such that the contact structures 130 (FIG. 1) are substantially devoid of the crystalline material 140.

While the crystalline material 140 has been substantially completely converted to the amorphous material 142 and is not present in the perspective of FIG. 2C, the crystalline material 140 may be present in other portions (not shown) of the apparatus 100, such as in portions of the apparatus 100 distal to the openings 136. The crystalline material 140 may be present (e.g., visible), for example, in peripheral regions of the apparatus 100. In other words, portions of the crystalline material 140 may remain between the monocrystalline semiconductor material 120 and the amorphous material 142 in the other portions of the apparatus 100. Therefore, although the amorphous material 142 is directly adjacent to the upper boundary 138 of the monocrystalline semiconductor material 120 of the apparatus 100 in the perspective shown in FIG. 2C, the other portions of the apparatus 100 may include portions of the crystalline material 140 between the monocrystalline semiconductor material 120 and the amorphous material 142.

The amorphous material 142 may directly contact the monocrystalline semiconductor material 120 along an interface 144 (corresponding to the upper boundary 138 of the monocrystalline semiconductor material 120). Lower surfaces of the amorphous material 142 may be in direct physical contact with the upper boundary 138 of the monocrystalline semiconductor material 120 along the interface 144 (e.g., horizontal interface) therebetween. Thus, the amorphous material 142 may be directly adjacent to the monocrystalline semiconductor material 120. In some embodiments, formation of the amorphous material 142 may maintain the abrupt transition 139 (FIG. 2A) of the upper boundary 138 of the monocrystalline semiconductor material 120. In other embodiments, formation of the amorphous material 142 may result in formation of a smooth transition 141 (e.g., rounded surface, curved surface) along the interface 144 between the monocrystalline semiconductor material 120 and the amorphous material 142, as shown in FIG. 2C. The smooth transition 141 may replace the abrupt transition 139 and may be centrally located (e.g., in the X-direction) within the openings 136.

Figure 2D:
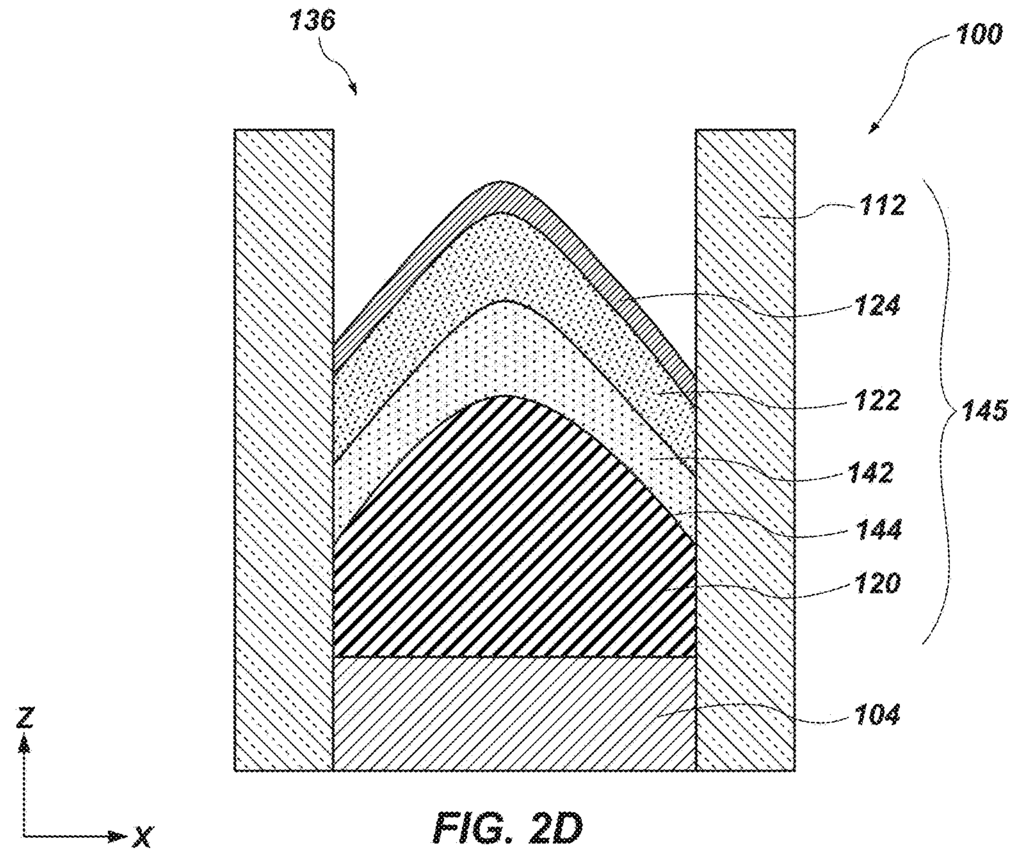

After forming the amorphous material 142, portions (e.g., upper portions) of the amorphous material 142 may be converted to the metal silicide 122, as shown in FIG. 2D. The metal silicide 122 may be formed adjacent to (e.g., over) the monocrystalline semiconductor material 120. In some embodiments, the metal silicide 122 may be formed within portions (e.g., upper portions) of the amorphous material 142 and additional portions (e.g., lower portions) of the amorphous material 142 may not include the metal silicide 122. Alternatively, substantially all of the amorphous material 142 may include the metal silicide 122 such that the metal silicide 122 is directly adjacent to (e.g., directly over) the monocrystalline semiconductor material 120 along the upper boundary 138 thereof.

A metal of the metal silicide 122 may be a transition metal including, but not limited to, cobalt, molybdenum, nickel, palladium, platinum, tantalum, titanium, or tungsten. The metal silicide 122 may be cobalt silicide (CoSi), molybdenum silicide (MoSi), nickel silicide (NiSi), palladium silicide (PdSi), platinum silicide (PtSi), tantalum silicide (TaSi), titanium silicide (TiSi), or tungsten silicide (WSi). The metal silicide 122 may be formed by a silicidation process that is conducted after cleaning the openings 136 and the amorphous material 142. The metal silicide 122 may be formed in the openings 136 by sputtering the metal from a metal target, conducting an anneal act, and conducting a wet etch act. During the anneal act, metal atoms of the metal target react with silicon atoms of the amorphous material 142. By way of example only, a dilute hydrogen fluoride (300:1 water:hydrogen fluoride) wet etch chemistry may be used to clean the openings 136, followed by sputtering the metal (e.g., titanium) from the metal target into the openings 136 to form about 3 nm of the metal, conducting a rapid thermal anneal (RTA) act at about 660° C. for about 25 seconds, and using a wet etch chemistry to remove excess metal.

In additional embodiments, the wet etch chemistry may include hydrochloric acid (HCl). For example, excess portions of one or more of the amorphous material 142 and the metal silicide 122 may be removed by an in situ material removal (e.g., etch) act using flow of HCl. In some embodiments, a flow rate of HCl may be reduced and an amount of time allotted to flow the HCl may be increased to reduce damage of surrounding materials upon removal of the excess portions of the materials. Further, materials of the crystalline material 140 may be formulated to be resistant to removal under some etch conditions, so that the materials of the amorphous material 142 and the metal silicide 122 are selectively etchable relative to the crystalline material 140. As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

With the silicidation act, a portion, such as an upper portion, of the amorphous material 142 is converted to the metal silicide 122. The metal silicide 122 may be formed at a thickness of from about 1 nm to about 5 nm, although other thicknesses may be contemplated. The metal silicide 122 is in direct contact with the amorphous material 142 or, alternatively, the monocrystalline semiconductor material 120. In some embodiments, the metal silicide 122 is titanium silicide (TiSi). In other embodiments, the metal silicide 122 is tungsten silicide (WSi). The amorphous material 142 and the metal silicide 122 substantially lack polycrystalline silicide. In comparison, conventional contacts may include a polycrystalline silicide formed within a polycrystalline silicon overlying the monocrystalline silicon.

The barrier material 124 may, optionally, be formed adjacent to (e.g., over) the metal silicide 122. The barrier material 124 may be formed of and include a metal-containing material (e.g., a metal nitride). By way of example only, the barrier material 124 may include, but is not limited to, tungsten, titanium, nickel, platinum, gold, cobalt, titanium nitride (TiN), tantalum nitride (TaN), tungsten nitride (WN), titanium aluminum nitride (TiAlN), or a combination thereof. In some embodiments, the barrier material 124 is formed of TiN. In other embodiments, the barrier material 124 is formed of WN. The barrier material 124 may be formed using one or more conventional deposition processes, such as one or more of a CVD process and a PVD process. Formation of the barrier material 124 results in formation of an epitaxial plug 145 (e.g., a doped epitaxial plug, such as a phosphorus doped epitaxial plug). The monocrystalline semiconductor material 120, the amorphous material 142, if present, the metal silicide 122, and the barrier material 124, if present, constitute the epitaxial plug 145.

Figure 2E:
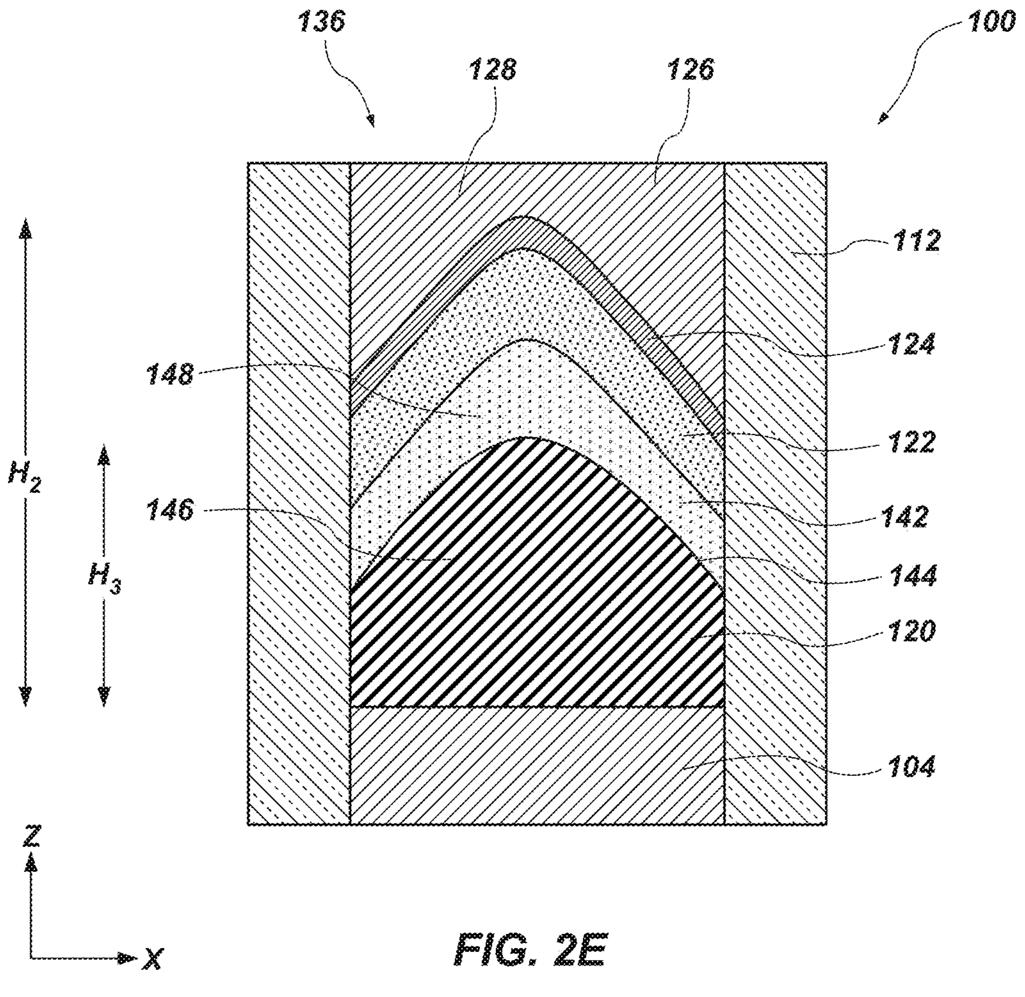
Figure 2F:
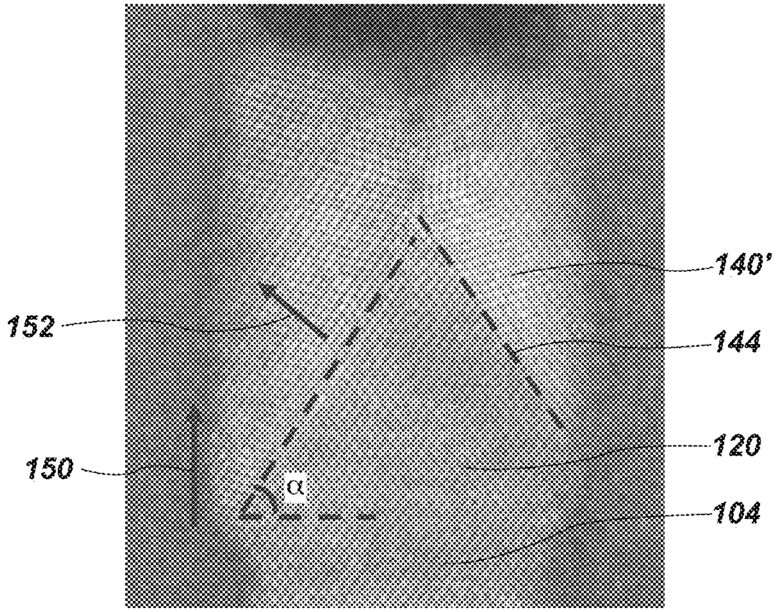
FIGS. 2F and 2G are micrographs of contact structures according to embodiments of the disclosure.
Figure 2G:
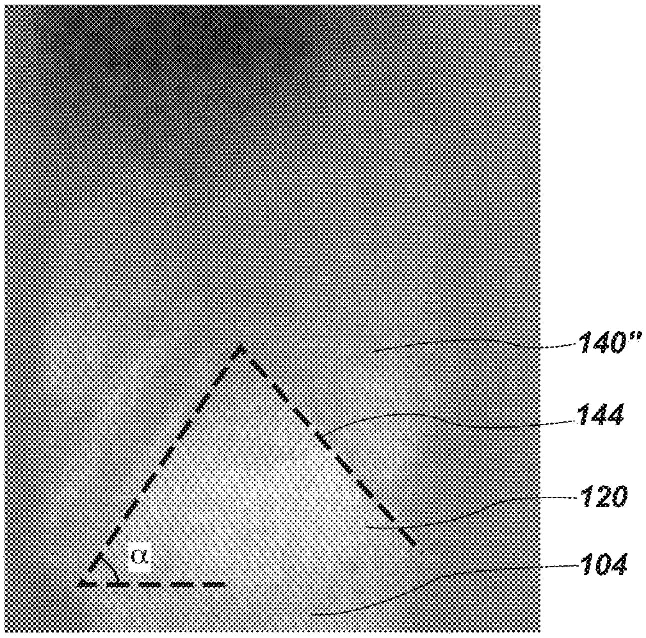

As shown in FIG. 2E, the metal material 126 may be formed over the barrier material 124 and between the digit line structures 118 (FIG. 1) and adjacent portions of the insulative spacer material 112. At the process stage of FIG. 2E, the insulative spacer material 112 may include substantially straight, vertical sidewalls, without voids (e.g., spaces). The barrier material 124 may vertically intervene between the metal silicide 122 and the metal material 126. The metal material 126 may be formed by conventional techniques. The metal material 126 may be a transition metal, a metal alloy, a metal nitride, a metal silicide, a metal carbide, or a metal oxide including, but not limited to, tungsten, titanium, nickel, platinum, gold, rhodium, iridium, ruthenium, ruthenium oxide, titanium nitride, tantalum nitride, tungsten nitride, titanium aluminum nitride, or alloys thereof. In some embodiments, the metal material 126 is tungsten. In other embodiments, the metal material 126 is titanium nitride. Subsequent process acts may be conducted to form the cell contacts 128 from the metal material 126. For example, the metal material 126 may be patterned by conventional photolithography and etch techniques to form the cell contacts 128, as shown in FIGS. 1 and 2E. The epitaxial plug 145 (FIG. 2D) may vertically intervene between the cell contacts 128 and the active areas 104.

The epitaxial plug 145 (FIG. 2D) of the contact structures 130 (FIG. 1) may include a first region 146 (e.g., a highly ordered region) and a second region 148 (e.g., a highly disordered region) overlying the first region 146. For example, the epitaxial plug 145 may include the monocrystalline semiconductor material 120 including facets within the first region 146 and one or more of the amorphous material 142 and the metal silicide 122 within the second region 148 that is substantially devoid of facets at the process stage of FIG. 2E. Thus, the first region 146 includes a crystalline (e.g., highly ordered) material vertically intervening between the active areas 104 and the second region 148, and the second region 148 includes an amorphous (e.g., highly disordered) material vertically intervening between the first region 146 and the cell contacts 128. Formation of the crystalline material 140 (FIG. 2B), which is a highly disordered crystalline material including multi-directional crystal orientations within the crystalline material 140, may provide an increased area of the crystalline material over the monocrystalline semiconductor material 120 for formation of the metal silicide 122 within the amorphous material 142.

The monocrystalline semiconductor material 120 may exhibit a third height $H_3$, and the epitaxial plug 145 (FIG. 2D) (e.g., a combination of the monocrystalline semiconductor material 120, the amorphous material 142, if present, the metal silicide 122, and the barrier material 124) may exhibit the second height $H_2$ that is relatively greater than the third height $H_3$ of the monocrystalline semiconductor material 120. Accordingly, the second height $H_2$ corresponds to the vertical thickness of the epitaxial plug 145 and is relatively greater than the third height $H_3$ of the monocrystalline semiconductor material 120. The third height $H_3$ of the monocrystalline semiconductor material 120 may be within a range of from about 5 nm to about 30 nm, such as from about 5 nm to about 10 nm, from about 10 nm to about 15 nm, from about 15 nm to about 20 nm, or from about 20 nm to about 30 nm. However, the disclosure is not so limited and the third height $H_3$ may be different than those described above. The second height $H_2$ may, for example, be within a range of from about 200 percent to about 500 percent (e.g., from about 200 percent to about 300 percent, from about 300 percent to about 400 percent, from about 400 percent to about 500 percent) larger than the third height $H_3$. The second height $H_2$ may be between about 2 and 5 times (e.g., 3 times) greater than the third height $H_3$ of the monocrystalline semiconductor material 120. In some embodiments, the second height $H_2$ of the epitaxial plug 145 is equal to or greater than about 15 nm (e.g., from about 15 nm to about 65 nm). The second height $H_2$ of the epitaxial plug 145 is selected to facilitate a desired vertical distance between the active areas 104 and the cell contacts 128, and to facilitate desired electroresistivity of the contact structures 130 (FIG. 1) that is relatively lower than conventional contact structures of conventional apparatus. Since the width $W_1$ (FIG. 1) of the openings 136 and, hence, a width of the monocrystalline semiconductor material 120 may be equal to or less than about 25 nm (e.g., about 10 nm, about 8 nm) and the second height $H_2$ of the epitaxial plug 145 may be equal to or greater than about 15 nm, the second height $H_2$ (e.g., in the Z-direction) may be relatively greater than a width (e.g., in the X-direction) thereof. However, the disclosure is not so limited and the relative width and height of the materials may be different than those described above.

The relative height of the epitaxial plug 145 (FIG. 2D) of the contact structures 130 (FIG. 1) according to embodiments of the disclosure may be larger in size than conventional epitaxial plugs of conventional contacts since the crystalline material 140 (FIG. 2B) increases a height of the monocrystalline semiconductor material 120 prior to forming the metal silicide 122 within the amorphous material 142. For example, heights of conventional epitaxial plugs of contacts may be limited by so-called "edge-constrained growth" of crystalline material exhibiting a relatively low growth rate of the (111) silicon crystal orientation within openings having reduced dimensions. Since epitaxial plugs of conventional contacts are not formed with additional crystalline material over the monocrystalline semiconductor material, the volume of space occupied by the epitaxial plugs of the conventional contacts is smaller than the volume of space occupied by the epitaxial plug 145 of the contact structures 130 (FIG. 1) according to embodiments of the disclosure. Instead, metal silicide of conventional contacts is relatively closer to the active areas 104.

Therefore, a larger volume of crystalline material (e.g., the monocrystalline semiconductor material 120 in combination with the crystalline material 140) of the contact structures 130 of the apparatus 100 may be available for formation of the metal silicide 122 thereover relative to the conventional contacts. By having an increased volume of the crystalline material of the epitaxial plug 145 in the contact structures 130 and having a larger volume of the amorphous material 142 available for the metal silicide 122 over the monocrystalline semiconductor material 120, the contact resistance of the apparatus 100 may be reduced and thermal stability of the epitaxial plug 145 may be increased. By way of example only, the contact resistance of the apparatus 100 may be less than or equal to about 45 kOhm/cell.

As shown in FIG. 2F, by using the single, continuous epitaxial growth process, the crystalline material 140 (FIG.

2B) is formed over and in direct contact with the monocrystalline semiconductor material 120, which is formed over (e.g., in direct contact with) the monocrystalline silicon of the active areas 104. FIG. 2F illustrates the apparatus 100 at the process stage of FIG. 2B. In some embodiments, the contact structures 130 (FIG. 1) are formed to include a nanocrystalline material 140' of the crystalline material 140. The nanocrystalline material 140' is formed (e.g., epitaxially grown) directly adjacent to the monocrystalline semiconductor material 120 at the interface 144 (e.g., a facet interface) prior to forming the amorphous material 142 (FIG. 2E). The nanocrystalline material 140' is a highly disordered crystalline material overlying the highly ordered and faceted crystalline material of the monocrystalline semiconductor material 120. The nanocrystalline material 140' may be substantially free of voids or spaces (e.g., gaps).

The contact structures 130 may include a first crystal orientation 150 and a second crystal orientation 152 that differs from the first crystal orientation 150. In some embodiments, the first crystal orientation 150 includes a (100) silicon crystal orientation, and the second crystal orientation 152 includes a (111) silicon crystal orientation. The first crystal orientation 150 of the monocrystalline semiconductor material 120 and the second crystal orientation 152 of the nanocrystalline material 140' may be formed without forming a polycrystalline material over the monocrystalline semiconductor material 120. An angle α is defined by an intersection between a lower surface of the monocrystalline semiconductor material 120 (e.g., substantially parallel to a major surface of the base material 102 (FIG. 1)) and the interface 144 between the monocrystalline semiconductor material 120 and the nanocrystalline material 140'. In some embodiments, the angle α is about 54.7 degrees. Without being bound by any theory, it is believed that planes of the nanocrystalline material 140' including the (111) silicon crystal orientation of the second crystal orientation 152 form an about 54.7 degree angle with planes of the monocrystalline semiconductor material 120 including the (100) silicon crystal orientation of the first crystal orientation 150. Accordingly, the interface 144 is sloped, forming the angle α of about 54.7 degrees with respect to the major surface of the base material 102. Thereafter, portions (e.g., substantially all) of the nanocrystalline material 140' may be converted to the amorphous material 142, as described with reference to FIG. 2C.

As shown in FIG. 2G, the contact structures 130 are formed to include a semi-crystalline material 140" (e.g., a partially crystalline material) of the crystalline material 140 over the monocrystalline semiconductor material 120. FIG. 2G also illustrates the apparatus 100 at the process stage of FIG. 2B. However, the apparatus 100 of FIG. 2G includes the semi-crystalline material 140" rather than the nanocrystalline material 140'. The semi-crystalline material 140" is directly adjacent to the monocrystalline semiconductor material 120 at the interface 144 prior to forming the amorphous material 142 (FIG. 2E). The angle α of the interface 144 may be about 54.7 degrees or, alternatively, the angle α may differ from that of the previous embodiment of FIG. 2F. Further, the contact structures 130 of FIG. 2G may include the first crystal orientation 150 (FIG. 2F) (e.g., the (100) silicon crystal orientation). However, the semi-crystalline material 140" may not include the second crystal orientation 152 (FIG. 2F). Rather, the semi-crystalline material 140" may include varying (e.g., multiple) crystal orientations at the process stage of FIG. 2B. In some embodiments, the semi-crystalline material 140" may be formed without conducting an implant process (a PAI process). The semi-crystalline material 140" may include regions of crystalline material embedded within an amorphous material. For example, the semi-crystalline material 140" may be formed to include one or more localized regions of nanocrystalline material, polycrystalline material, and single crystals. Thereafter, portions (e.g., substantially all) of the semi-crystalline material 140" may be converted to the amorphous material 142, as described with reference to FIG. 2C.

Without being bound by any theory, it is believed that electrical conductivity in the apparatus 100 including the contact structures 130 according to embodiments of the disclosure is increased and contact resistance is reduced due to the (100) silicon crystal orientation of the monocrystalline semiconductor material 120 and one or more of the (111) silicon crystal orientation of the nanocrystalline material 140' and the varying crystal orientations of the semi-crystalline material 140", which are in direct contact with one another along the interface 144 therebetween. By varying the process conditions during the single, substantially continuous process, one or more of twin defects and stacking faults may be naturally formed across the (111) silicon crystal orientation of the nanocrystalline material 140', which may reduce strain and promote growth from the monocrystalline semiconductor material 120 to the nanocrystalline material 140' along the interface 144. The semi-crystalline material 140" may be formed by using alternative process conditions. By utilizing one or more of the nanocrystalline material 140' and the semi-crystalline material 140", the electrical conductivity is increased and the contact resistance is decreased compared to conventional contacts including a metal silicide formed within a material (e.g., a polycrystalline material) overlying a monocrystalline semiconductor material.

In some instances, damage may occur to the monocrystalline semiconductor material during subsequent process acts (e.g., implant process acts). With one or more of the nanocrystalline material 140' and the semi-crystalline material 140" overlying the monocrystalline semiconductor material 120, the monocrystalline semiconductor material 120 may be protected from damage during the subsequent process acts used to form the contact structures 130, allowing for improved electrical conductivity during use and operation of the apparatus 100. The decreased damage to the contact structures 130 may further reduce the contact resistance of the apparatus 100. In comparison, when materials of conventional contacts are subjected to subsequent process acts, crystalline structures of an underlying monocrystalline semiconductor material may experience damage. The damaged regions within the monocrystalline semiconductor material cause reduced current, which leads to increased contact resistance of conventional contacts.

Figure 2H:
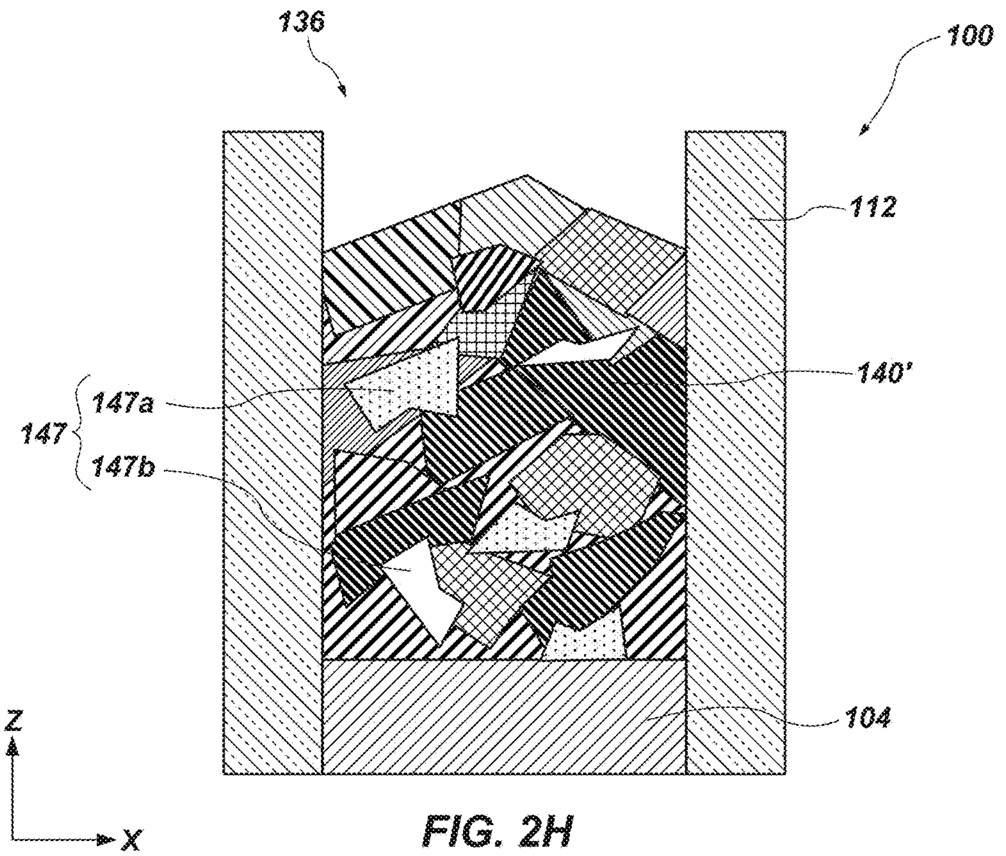
FIGS. 2H through 2J are simplified, partial cross-sectional views illustrating a method of forming the apparatus according to embodiments of the disclosure.
Figure 2I:
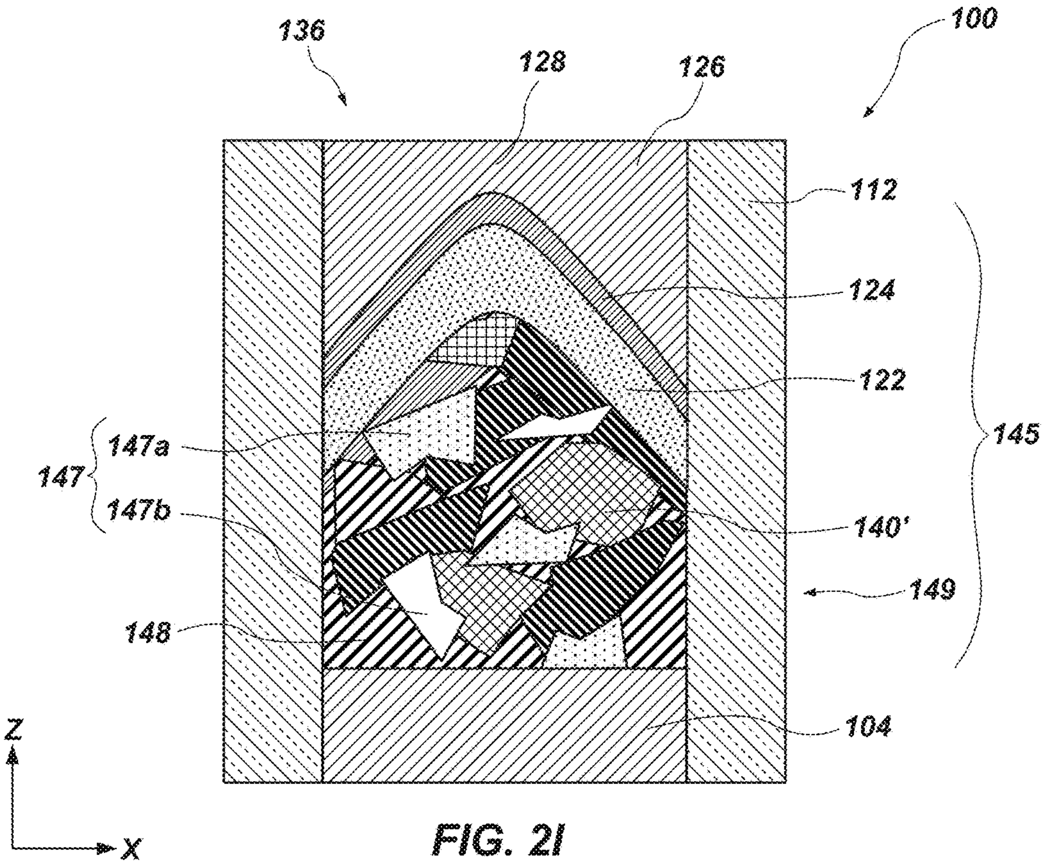
Figure 2J:
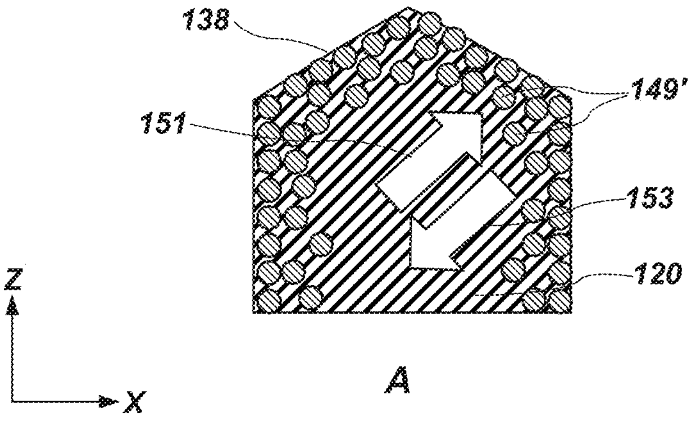
Figure 2J:
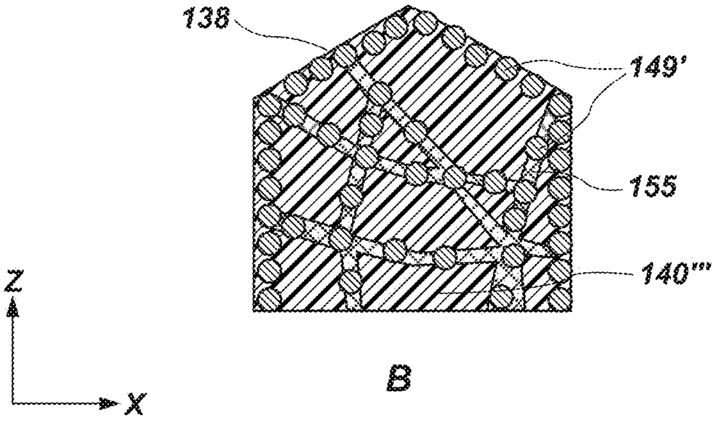
Figure 2J:
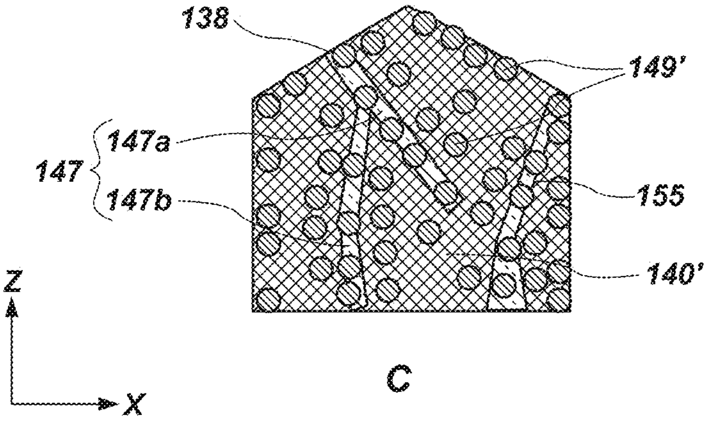

FIGS. 2H through 2J illustrate simplified, partial cross-sectional views of additional embodiments of the apparatus 100. FIG. 2H illustrates the apparatus 100 at a similar processing stage to that depicted in FIG. 2B, and FIG. 2I illustrates the apparatus 100 at a similar processing stage to that depicted in FIG. 2E. FIG. 2J illustrates portions of differing crystalline semiconductor materials (e.g., monocrystalline material, polycrystalline material, nanocrystalline material) of contact structures, such as the contact structures 130 illustrated in FIG. 1. As illustrated in FIGS. 2A through 2G, the apparatus 100 may be formed to include the monocrystalline semiconductor material 120 over the active areas 104 and the crystalline material 140 over the monocrystalline semiconductor material 120. In the additional embodiments of FIGS. 2H through 2J, the apparatus 100 may be formed to include the crystalline material 140 (e.g., the nanocrystalline material 140') over the active areas 104, without forming the monocrystalline semiconductor material 120 therebetween.

As shown in FIG. 2H, the nanocrystalline material 140' may be formed over (e.g., on, directly on) the active areas 104. For clarity and ease of understanding the drawings and associated descriptions, the nanocrystalline material 140' of FIG. 2H includes multiple crosshatchings to illustrate multi-directional crystal orientations within the nanocrystalline material 140'. The nanocrystalline material 140' (e.g., nanocrystalline silicon material) may be doped, such as with an n-type dopant. The nanocrystalline material 140' may, for example, be implanted with phosphorus atoms (e.g., P-doped nanocrystalline material 140') or other dopant atoms. In some embodiments, the nanocrystalline material 140' may be implanted with an increased concentration of the dopant atoms (e.g., phosphorus atoms) relative to conventional contacts. By way of non-limiting example, a concentration of the dopant atoms within the nanocrystalline material 140' may be within a range of from about 3 atomic percent to about 6 atomic percent. Accordingly, the concentration of the dopant atoms within the nanocrystalline material 140' may be at least about two times (2×) greater than a concentration of dopant atoms of crystalline material of conventional contact structures, such as about three times (3×) greater than a concentration of dopant atoms. The silicon of the active areas 104 functions as a seed material to orient one or more additional crystal forms of the nanocrystalline material 140'.

The nanocrystalline material 140' may include regions of noncrystalline material embedded within nanocrystalline material 140'. For example, the nanocrystalline material 140' may include localized regions 147 including one or more of amorphous regions 147*a* and defect regions 147*b*. The nanocrystalline material 140' may include a crystalline material that is a highly disordered crystalline material including low growth rate facets formed (e.g., grown) on the active areas 104. The amorphous regions 147*a* may include an amorphous material. As used herein, the term "amorphous," when referring to a material, means and refers to a material having a substantially noncrystalline structure. The defect regions 147*b* may include voids (e.g., gaps, spaces) separating adjacent regions of the crystalline material of the nanocrystalline material 140' from one another. The localized regions 147 may individually be separated from one another by portions of the nanocrystalline material 140'. In some embodiments, some of the localized regions 147 may be substantially surrounded by the nanocrystalline material 140'. Additionally, or alternatively, some of the localized regions 147 may be adjacent a perimeter of the nanocrystalline material 140' (e.g., adjacent to one or more of the active areas 104 and the insulative spacer material 112). Further, some of the localized regions 147 may be adjacent to one another (e.g., the amorphous regions 147*a* may be adjacent to the defect regions 147*b*).

The nanocrystalline material 140' is formed in the openings 136 by an epitaxial growth process and substantially completely fills lower portions of the openings 136, without being formed in upper portions thereof. During formation of the nanocrystalline material 140', one or more of the process conditions may be varied to form the localized regions 147. For example, processing conditions, such as temperature, pressure, dopant concentration, dopant species, precursors, and gas flow rates of the precursors, may be varied as appropriate for formation of the localized regions 147 within the nanocrystalline material 140'. The nanocrystalline material 140' including the localized regions 147 may be formed in the openings 136 by a single, substantially continuous process. As the process conditions are varied, crystal orientations of the silicon may change to form the localized regions 147. Locations at which the localized regions 147 form may be controlled by adjusting one or more of the process conditions during formation of the nanocrystalline material 140'.

As shown in FIG. 2I, the metal silicide 122 may be formed within portions of the nanocrystalline material 140'. For example, upper portions of the nanocrystalline material 140' may be converted to the amorphous material 142 (not shown) and the metal silicide 122 may be formed within portions (e.g., upper portions, an entirety of) the amorphous material 142. Portions of the amorphous material 142 may or may not remain in the apparatus 100. Additional portions (e.g., lower portions) of the nanocrystalline material 140' may remain in the apparatus 100. In some embodiments, the metal silicide 122 directly contacts the nanocrystalline material 140', and nanocrystalline material 140' is directly between the active areas 104 and the metal silicide 122. The barrier material 124 may, optionally, be formed adjacent to (e.g., over) the metal silicide 122, resulting in formation of the epitaxial plug 145. The metal material 126 may be formed over the barrier material 124 and between the adjacent portions of the insulative spacer material 112 to form the cell contacts 128.

The epitaxial plug 145 of the contact structures 130 (FIG. 1) of the embodiment of FIG. 2I may include the second region 148 (e.g., the highly disordered region) without including the first region 146 (FIG. 2E) (e.g., the highly ordered region). For example, the epitaxial plug 145 may include the nanocrystalline material 140' including the localized regions 147 and one or more of the amorphous material 142 (not shown) and the metal silicide 122 within the second region 148. The epitaxial plug 145 including the nanocrystalline material 140' of the embodiment of FIG. 2I may be substantially devoid of monocrystalline material and substantially devoid of polycrystalline material.

The nanocrystalline material 140' may be formed to include a doped region 149 including one or more dopants (e.g., an n-type dopant). The doped region 149 of the nanocrystalline material 140' may exhibit a substantially homogeneous distribution of the dopants within the material thereof. For example, formation of the localized regions 147 may facilitate one or more of increased concentration and homogeneous distribution of the dopants to improve so-called "dopant segregation" at grain boundaries compared to concentration and distribution of dopants within monocrystalline materials or polysilicon materials. Further, the homogeneous distribution of dopants of the doped region 149 may extend substantially continuously throughout the nanocrystalline material 140' given effective formation of the dopants along (e.g., through) the grain boundaries. Alternatively, the doped region 149 of the nanocrystalline material 140' may exhibit a substantially heterogeneous distribution of the dopants within the material thereof. As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature.

FIG. 2J illustrates a comparison of portions of differing crystalline semiconductor materials (e.g., monocrystalline material, polycrystalline material, nanocrystalline material) of contact structures (e.g., the contact structures 130 (FIG. 1)). A portion of the monocrystalline semiconductor material 120 of FIG. 2A is illustrated in image A of FIG. 2J, a portion of a polycrystalline material 140''' of conventional contact structures is illustrated in image B, and a portion of the nanocrystalline material 140' of FIG. 2H is illustrated in image C. For clarity and ease of understanding the drawings and associated description, surrounding materials, including the active areas 104 and the insulative spacer material 112, are omitted in the simplified, partial cross-sectional views of the images A, B, and C of FIG. 2J.

As shown in FIG. 2J, crystallinity of the differing crystalline semiconductor materials may vary responsive, at least in part, to varying the process conditions used during formation of the materials over the active areas 104 (FIG. 1). For example, the crystallinity of the materials may vary from monocrystalline material (e.g., single crystal) to polycrystalline material (e.g., individual crystals separated by grain boundaries and exhibiting random crystallographic orientations). In addition, the crystallinity of nanocrystalline material (e.g., nano-sized crystals including localized regions) may be within a range between the crystallinity of the monocrystalline material and the polycrystalline material. The crystallinity of the materials may, in turn, affect dopant segregation (e.g., at the grain boundaries), resulting in varying levels of diffusion (e.g., distribution) of dopants within the materials. Without being bound by any theory, it is believed that balancing lattice strain (e.g., a measure of the distribution of lattice constants arising from crystal imperfections) of the crystalline semiconductor materials with the diffusion of the dopants may facilitate an increased homogenous distribution of the dopants.

As shown in image A of FIG. 2J, the contact structures 130 (FIG. 1) may be formed to include the monocrystalline semiconductor material 120. The lattice strain of the monocrystalline semiconductor material 120, as indicated by arrow 151, may affect dopant segregation. The diffusion of dopants, as indicated by arrow 153, may affect desegregation of one or more dopants 149' (e.g., phosphorus). Since lattice strain within the monocrystalline semiconductor material 120 is relatively high and diffusion of the dopants 149' is relatively low given a lack of atomic movement, the dopants 149' may be predominantly located at a perimeter of the monocrystalline semiconductor material 120 (e.g., at the upper boundary 138 and side surfaces thereof). Notably, distribution of the dopants 149' within central portions and along lower surfaces of the monocrystalline semiconductor material 120 may be relatively less than the distribution of the dopants 149' at the upper boundary 138 and the side surfaces. For example, the dopants 149' may migrate (e.g., diverge) upward and laterally outward from the central portions of the monocrystalline semiconductor material 120, resulting in an uneven (e.g., heterogeneous) distribution of the dopants 149' in the monocrystalline semiconductor material 120.

As shown in image B of FIG. 2J, in contrast to formation of the monocrystalline semiconductor material 120 of image A, conventional contact structures may be formed to include the polycrystalline material 140'''. Although lattice strain within the polycrystalline material 140''' is relatively low, diffusion of the dopants 149' may be negligible given a relatively low tendency of the polycrystalline material 140''' (e.g., polycrystalline silicon material) to retain the dopant atoms (e.g., phosphorus atoms) during substitutional reactions. Thus, the dopants 149' may be predominantly located at a perimeter of the polycrystalline material 140''' (e.g., at the upper boundary 138 and the side surfaces thereof). The dopants 149' may additionally be located along grain boundaries 155, without being evenly distributed within the polycrystalline material 140''', resulting in dopant segregation along the grain boundaries 155. Accordingly, formation of the monocrystalline semiconductor material 120 of image A may provide additional benefits compared to formation of polycrystalline material 140''' of conventional contact structures.

As shown in image C of FIG. 2J, the contact structures 130 (FIG. 1) may be formed to include the nanocrystalline material 140'. Since the nanocrystalline material 140' includes the localized regions 147 (e.g., the amorphous regions 147*a*, the defect regions 147*b*) within boundaries thereof, the lattice strain of the nanocrystalline material 140' may be relatively less than the lattice strain exhibited by the monocrystalline semiconductor material 120 of image A. Further, diffusion of the dopants 149' within the nanocrystalline material 140' may be relatively greater than diffusion of the dopants 149' within the monocrystalline semiconductor material 120, allowing increased balance between the lattice strain and the diffusion of the dopants 149'. With the increased balance, greater concentrations of the dopants 149' may be located within the central portions of the nanocrystalline material 140' rather than being located only at the upper boundary 138 and the side surfaces thereof. Additionally, the nanocrystalline material 140' may exhibit a relatively higher tendency to retain the dopant atoms within the material thereof during the substitutional reactions. The increased balance and greater retention of the dopant atoms within the nanocrystalline material 140' of image C may allow a relatively greater homogeneous distribution of the dopants 149' throughout the nanocrystalline material 140', compared to the materials of images A and B.

Further, since the nanocrystalline material 140' includes an increased concentration (e.g., between about 3 atomic percent and about 6 atomic percent) of the dopants 149' within the doped region 149, the nanocrystalline material 140' may exhibit a relatively greater concentration of the dopants 149', in addition to the relatively greater homogenous distribution of the dopants 149', compared to concentration and distribution of the dopants 149' within one or more (e.g., each) of the monocrystalline semiconductor material 120 of image A and the polycrystalline material 140''' of image B. For example, diffusion of the dopants 149' within the nanocrystalline material 140' including the localized regions 147, coupled with an increased concentration of the dopants 149', may allow an increased concentration of the dopants 149' to diffuse homogeneously throughout (e.g., an entirety of) the nanocrystalline material 140'.

To determine an effective amount of crystallinity, contact structures similar to that shown in FIG. 1 were prepared as described above for FIGS. 2A through 2G, and FIGS. 2H and 2I. Samples of the contact structures included differing crystalline semiconductor materials (e.g., monocrystalline material, relatively small amounts of nanocrystalline material, and/or relatively large amounts of nanocrystalline material). Three (3) samples were prepared exhibiting the differing crystalline semiconductor materials. Relative amounts of crystallinity were within a range of from about 100 percent (e.g., substantially entirely monocrystalline material) to about 50 percent nanocrystalline material. Crystallinity properties, dopant concentrations, and electrical results were determined by conventional techniques. In particular, crystallinity percentage measurements were obtained to determine relative amounts of dopant concentration and associated electrical results observed in the samples. It was determined that a reduced (e.g., lower) level of crystallinity of the sample exhibiting the relatively large amounts of nanocrystalline material, without forming polycrystalline material, resulted in improved (e.g., reduced) dopant segregation (e.g., at the grain boundaries), as well as improved (e.g., increased) concentrations of the dopant atoms, which resulted in reduced contact resistance.

Without being bound by any theory, it is believed that the grain boundaries 155 (e.g., so-called "fast diffusion interfaces") of the amorphous regions 147*a* and the defect regions 147*b* of the localized regions 147 of the nanocrystalline material 140' improve the diffusion of the dopants 149' by allowing the dopant atoms to migrate rapidly. These results were unexpected and surprising. Therefore, it was determined that including the localized regions 147 within the relatively large amounts of the nanocrystalline material 140' improved dopant segregation and improved homogeneous distribution of the dopants 149' throughout the nanocrystalline material 140'. Accordingly, formation of nanocrystalline material 140' including the localized regions 147, as shown in image C, may provide additional benefits compared to formation of the monocrystalline semiconductor material 120 of image A and the polycrystalline material 140''' of image B.

Therefore, formation of the localized regions 147 within the nanocrystalline material 140' may allow for increased concentration and distribution of the dopants to mitigate dopant segregation by lowering crystallinity, without forming polycrystalline material. For example, grain boundary diffusion within the nanocrystalline material 140' including the localized regions 147 may allow increased concentration of the dopants, as well as allowing the dopants to diffuse homogeneously throughout the material thereof. Accordingly, silicidation voids within the metal silicide 122 (FIG. 2I), formed at least in part by dopant segregation, may be mitigated and contact resistance may be reduced. In some embodiments, contact resistance may be reduced by about 35 percent, or even a higher percentage (e.g., about 50 percent), compared to contact resistance of conventional apparatus.

For clarity and case of understanding the drawings and associated descriptions, the embodiments of FIGS. 2A through 2G and the additional embodiments of FIGS. 2H through 2J of the apparatus 100 are illustrated and described separately. However, it is understood that the embodiments may be combined. For example, the apparatus 100 including the monocrystalline semiconductor material 120 formed over the active areas 104 may additionally be formed to include the localized regions 147 within the nanocrystalline material 140' overlying the monocrystalline semiconductor material 120.

Figure 3A:
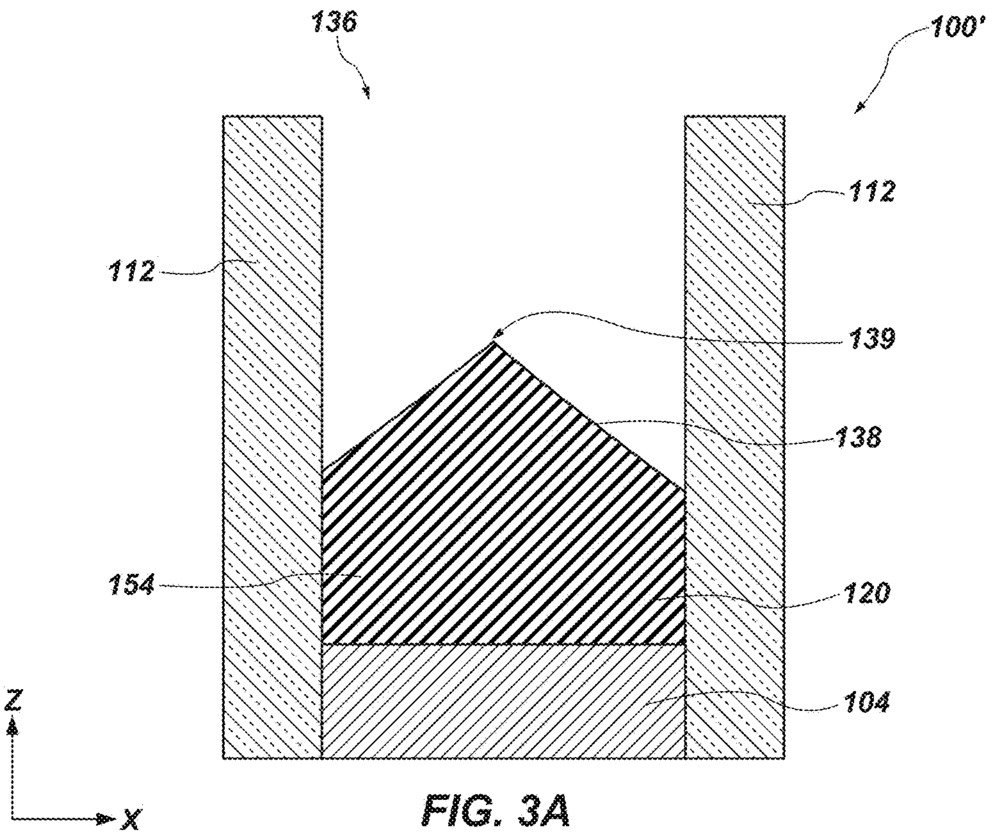
FIGS. 3A through 3D are simplified, partial cross-sectional views illustrating a method of forming the apparatus according to additional embodiments of the disclosure.
Figure 3B:
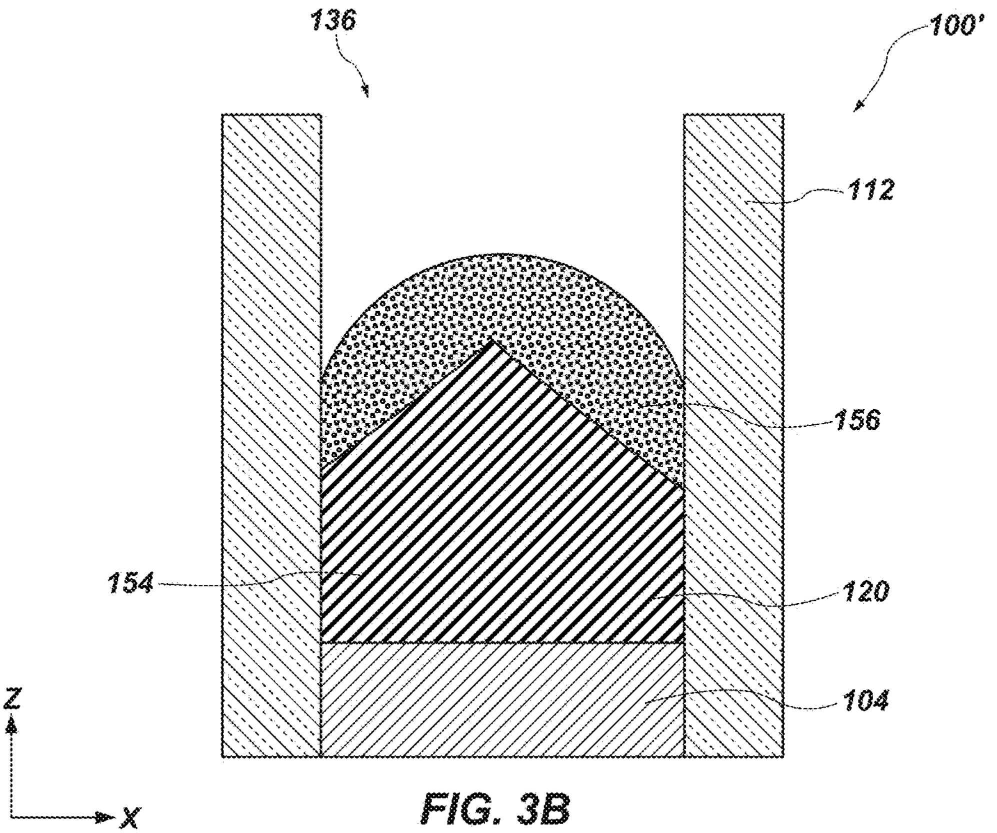
Figure 3C:
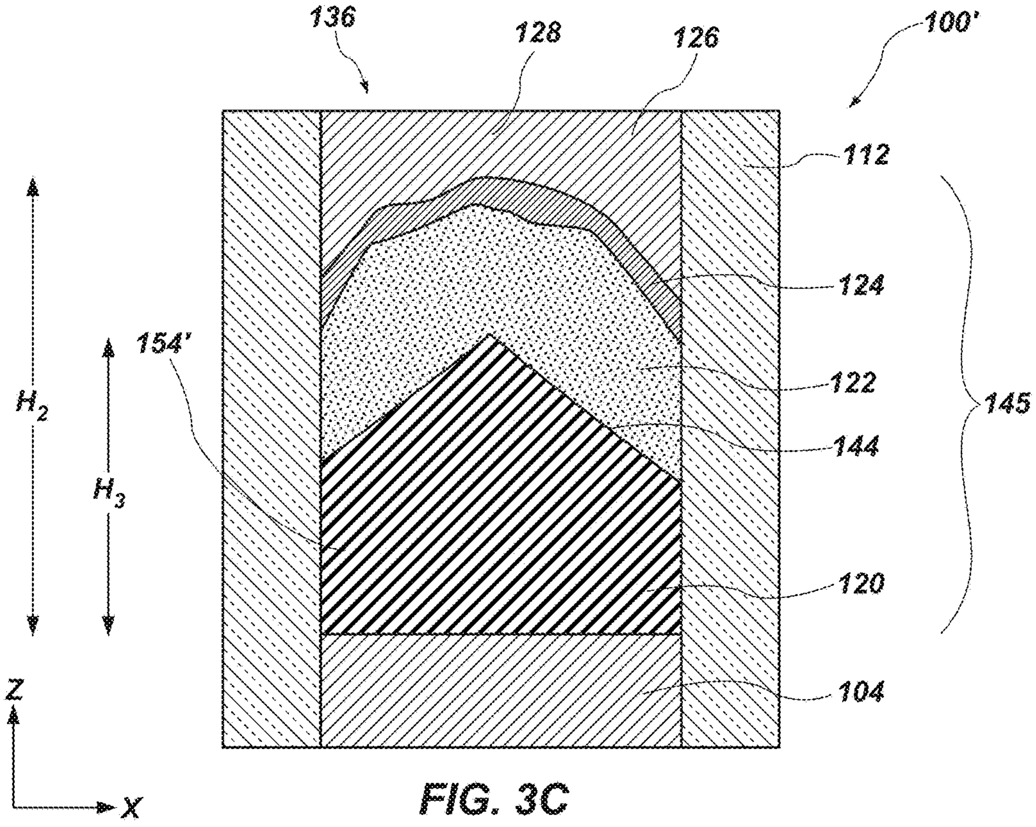
Figure 3D:
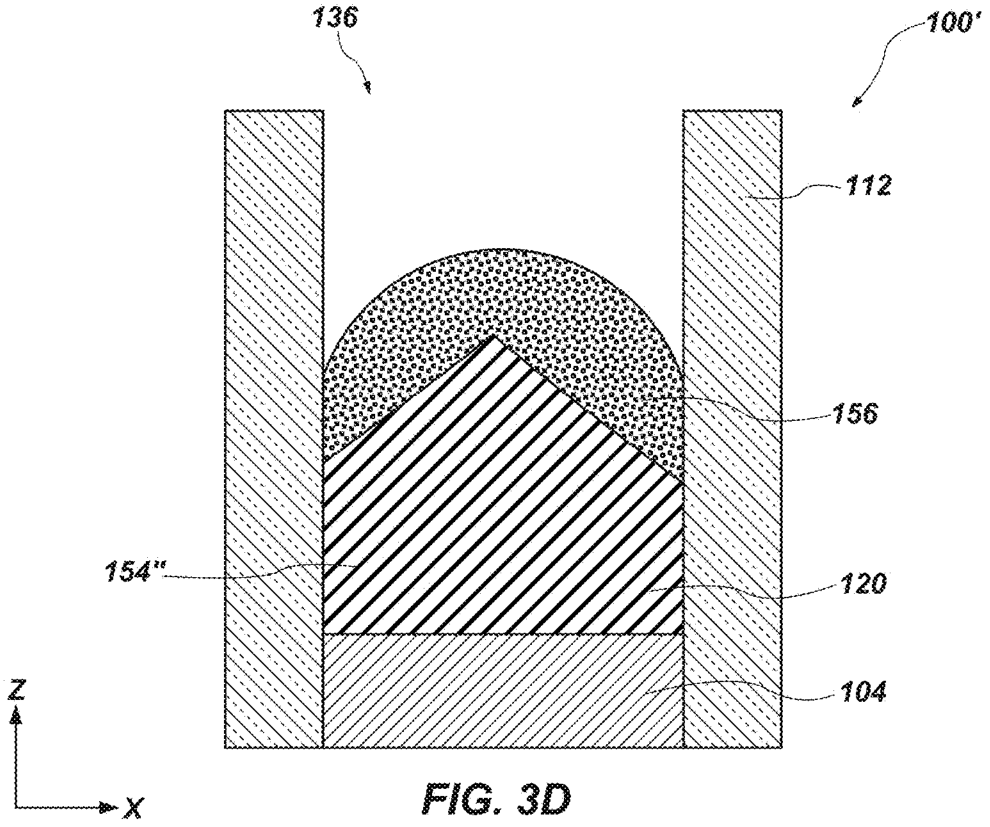

FIGS. 3A through 3C show simplified, partial cross-sectional views of a method of forming an apparatus having a different configuration than the apparatus 100. FIG. 3A illustrates a simplified, partial cross-sectional view of an apparatus 100'. At the processing stage depicted in FIG. 3A the apparatus 100' may be substantially similar to the apparatus 100 at the processing stage depicted in FIG. 2A. FIG. 3D illustrates an additional embodiment of the apparatus 100' at the process stage of FIG. 3B. The apparatus 100' may include the active areas 104 formed in the base material 102 (FIG. 1) and the monocrystalline semiconductor material 120 formed over the active areas 104 within the openings 136 defined by sidewalls of the insulative spacer material 112. The upper boundary 138 of the monocrystalline semiconductor material 120 may include the abrupt transition 139.

The monocrystalline semiconductor material 120 of the apparatus 100' may be doped, such as with an n-type dopant within a doped region 154. The monocrystalline semiconductor material 120 may, for example, be implanted with phosphorus atoms (i.e., P-doped monocrystalline semiconductor material 120) or other dopant atoms. The doping of the monocrystalline semiconductor material 120 may be conducted by conventional techniques. In some embodiments, the monocrystalline semiconductor material 120 is P-doped monocrystalline semiconductor material 120. A dopant level of the doped region 154 may be selected to provide desired vertical dimensions to materials subsequently formed in the apparatus 100', as described below.

As shown in FIG. 3B, a doped amorphous material 156 may be formed over the monocrystalline semiconductor material 120. The monocrystalline semiconductor material 120 and the doped amorphous material 156 are formed by a single, substantially continuous process in which process conditions are varied (e.g., changed) such that the process conditions do not remain constant as both the monocrystalline semiconductor material 120 and the doped amorphous material 156 are formed. In some embodiments, the doped amorphous material 156 comprises an n-doped amorphous silicon material formed directly over the monocrystalline semiconductor material 120 in a single, substantially continuous process, without using an implant (Pre-Amorphization Implant (PAI)) process. In some embodiments, formation of the monocrystalline semiconductor material 120 and the doped amorphous material 156 includes formation of material exhibiting the (100) silicon crystal orientation and, optionally, the (111) silicon crystal orientation.

Without being bound by any theory, the substantially continuous process with varying process conditions may enable the monocrystalline semiconductor material 120 and the doped amorphous material 156 to be formed without forming native oxides on the monocrystalline semiconductor material 120. The monocrystalline semiconductor material 120 may be formed over the active areas 104, as described above. Thereafter, one or more of the process conditions may be varied to form the doped amorphous material 156. For example, a dopant level of a dopant including phosphorus atoms may be increased within regions immediately adjacent to the upper boundary 138 of the monocrystalline semiconductor material 120, flow of hydrochloric acid (HCl) may be decreased, and temperature may be decreased to form the doped amorphous material 156 over the monocrystalline semiconductor material 120, although other processes may be contemplated. Therefore, both monocrystalline (e.g., single crystal) and amorphous forms of silicon are formed in the openings 136 by a single, substantially continuous process. The monocrystalline semiconductor material 120 is formed initially in the openings 136 and the doped amorphous material 156 is subsequently formed over the monocrystalline semiconductor material 120 during the substantially continuous process.

In some embodiments, each of the monocrystalline semiconductor material 120 and the doped amorphous material 156 may be doped with phosphorus atoms. In some such embodiments, the dopant concentration in the doped amorphous material 156 and the doped region 154 of the monocrystalline semiconductor material 120 may differ from one another. For example, the doped amorphous material 156 may include a different (e.g., greater than) dopant concentration than a dopant concentration of the doped region 154 of the monocrystalline semiconductor material 120. Alternatively, the doped region 154 of the monocrystalline semiconductor material 120 may include a greater dopant concentration than a dopant concentration of the doped amorphous material 156.

Since an in situ growth process of an amorphous material is nonselective, the doped amorphous material 156 may substantially completely fill the openings 136. Thus, the process conditions may be further varied during the in situ growth process of the doped amorphous material 156 to provide a desired thickness (e.g., height) thereof. The apparatus 100' may, optionally, be exposed to one or more material removal processes to remove portions of the doped amorphous material 156 within upper regions of the openings 136. Formation of the doped amorphous material 156 may provide an increased area of material over the monocrystalline semiconductor material 120 for formation of the metal silicide 122 (FIG. 3C) within the doped amorphous material 156 without using an implant process. Accordingly, damage to the monocrystalline semiconductor material 120 during subsequent process acts may be mitigated and, thus, contact resistance may be reduced during use and operation of the apparatus 100' compared to conventional contacts that are subjected to an implant process.

After forming the doped amorphous material 156, at least a portion of the doped amorphous material 156 may be converted to the metal silicide 122, as shown in FIG. 3C. The metal silicide 122 is adjacent to (e.g., over) the monocrystalline semiconductor material 120. In some embodiments, the metal silicide 122 may be formed within portions (e.g., upper portions) of the doped amorphous material 156 and additional portions (e.g., lower portions) of the doped amorphous material 156 may lack (e.g., not include) the metal silicide 122. If present, the doped amorphous material 156 may directly contact the monocrystalline semiconductor material 120 along the interface 144 (corresponding to the upper boundary 138 of the monocrystalline semiconductor material 120). Alternatively, substantially all of the doped amorphous material 156 may include the metal silicide 122 such that the metal silicide 122 is directly adjacent to (e.g., directly over) the monocrystalline semiconductor material 120 along the upper boundary 138 (FIG. 3A) thereof. In some embodiments, the metal silicide 122 directly contacts the monocrystalline semiconductor material 120 along the interface 144 therebetween.

In some embodiments, formation of the doped amorphous material 156 may result in the abrupt transition 139 (FIG. 3A) of the upper boundary 138 of the monocrystalline semiconductor material 120 being maintained. In other embodiments, formation of the doped amorphous material 156 may result in formation of a smooth transition (e.g., rounded surface, curved surface) (not shown) along the interface 144 between the monocrystalline semiconductor material 120 and the doped amorphous material 156. Formation of the doped amorphous material 156 may provide an increased area of material over the monocrystalline semiconductor material 120 for formation of the metal silicide 122 within the doped amorphous material 156.

The barrier material 124 may, optionally, be formed adjacent to (e.g., over) the metal silicide 122, resulting in formation of the epitaxial plug 145. The monocrystalline semiconductor material 120, the doped amorphous material 156, if present, the metal silicide 122, and the barrier material 124, if present, constitute the epitaxial plug 145. The metal material 126 may be formed over the barrier material 124 and between the digit line structures 118 (FIG. 1) and adjacent portions of the insulative spacer material 112, resulting in formation of the cell contacts 128.

In some embodiments, the doped region 154 of the contact structures 130 (FIG. 1) is initially or, alternatively, subsequently formed to include a highly doped region 154' within the monocrystalline semiconductor material 120, as shown in FIG. 3C. A dopant level of the highly doped region 154' of the monocrystalline semiconductor material 120 may be relatively higher than a dopant level of conventional contact structures of conventional apparatus. The relatively higher dopant level of the highly doped region 154' may facilitate an increased height of the doped amorphous material 156 during formation thereof. Accordingly, the epitaxial plug 145 exhibits the second height $H_2$ that is relatively greater than the third height $H_3$ of the monocrystalline semiconductor material 120, as described in greater detail with reference to FIG. 2E. The relatively higher dopant level of the highly doped region 154' may also result in a relatively higher dopant level of the doped amorphous material 156, and formation of the metal silicide 122 may be enhanced by using the relatively higher dopant level of the doped amorphous material 156.

In additional embodiments, the doped region 154 (FIG. 3B) of the contact structures 130 (FIG. 1) is initially formed to include a low or undoped region 154" within the monocrystalline semiconductor material 120, as shown in FIG. 3D. FIG. 3D illustrates the apparatus 100' at the process stage of FIG. 3B. For example, an initial dopant level of the low or undoped region 154" of the monocrystalline semiconductor material 120 may be relatively lower than that of the embodiment of FIG. 3C. In addition, the dopant level of the low or undoped region 154" may be relatively lower than an initial dopant level of conventional contact structures of conventional apparatus. In some such embodiments, the doped amorphous material 156 may include a relatively higher dopant level than that of the monocrystalline semiconductor material 120. During subsequent processing of the contact structures 130, the dopant atoms (e.g., phosphorus atoms) may diffuse from the doped amorphous material 156 into the low or undoped region 154", resulting in an increased dopant level of the monocrystalline semiconductor material 120. Allowing the dopant atoms to diffuse from the doped amorphous material 156 to the low or undoped region 154" may facilitate an increased height of the doped amorphous material 156 during formation thereof. Further, forming the low or undoped region 154" of the monocrystalline semiconductor material 120 may include formation of additional material exhibiting the (111) silicon crystal orientation for further increasing a height of the doped amorphous material 156. The apparatus 100' may be subjected to additional process acts to form the materials of the epitaxial plug 145 (FIG. 3C) and the cell contacts 128 (FIG. 3C).

Since the doped amorphous material 156, illustrated in FIGS. 3B and 3D, is formed over the monocrystalline semiconductor material 120 and the metal silicide 122 (FIG. 3C) is formed within the doped amorphous material 156, the contact structures 130 (FIG. 1) of the apparatus 100' may be formed without conducting an implant process (a PAI process). Accordingly, manufacturing processes may be simplified and costs may be reduced. In some embodiments, the contact structures 130 are substantially devoid (e.g., substantially absent) of a precursor material (e.g., germanium (Ge), arsenic (As)) employed to conduct the implant process. The contact structures 130 may contain phosphorus atoms, without containing Ge atoms or As atoms within the monocrystalline semiconductor material 120 and the metal silicide 122 (e.g., above upper surfaces of the active areas 104). Forming the doped amorphous material 156 without conducting an implant process may reduce damage to the monocrystalline semiconductor material 120 during formation of the contact structures 130 of the apparatus 100'. Further, the doped amorphous material 156 may be substantially free of facets.

One of ordinary skill in the art will appreciate that, in accordance with additional embodiments of the disclosure, the features and feature configurations described above in relation to FIGS. 2A through 2I and 3A through 3D may be adapted to design needs of different apparatus (e.g., different electronic devices, different memory devices) depending on desired electrical performance properties of the apparatus. By way of non-limiting example, in accordance with additional embodiments of the disclosure, FIGS. 4A through 4G and 5A through 5D are simplified, partial cross-sectional views of additional methods of forming apparatus having a different configuration than the apparatus 100, 100'. FIG. 4E illustrates an enlarged portion of box E of FIG. 4D, and FIG. 5B illustrates an enlarged portion of box B of FIG. 5A. Throughout the remaining description and the accompanying figures, functionally similar features (e.g., materials, structures, devices) are referred to with similar reference numerals. To avoid repetition, not all features shown in the remaining figures (including FIGS. 4A through 4G and 5A through 5D) are described in detail herein. Rather, unless described otherwise below, a feature designated by a reference numeral of a previously described feature (whether the previously described feature is first described before the present paragraph, or is first described after the present paragraph) will be understood to be substantially similar to the previously described feature.

Figure 4A:
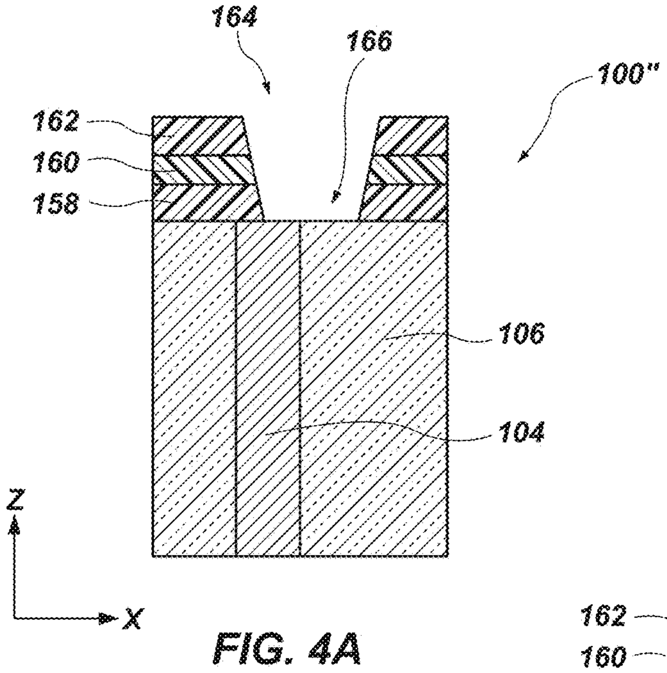
FIGS. 4A through 4G are simplified, partial cross-sectional views illustrating a method of forming the apparatus according to additional embodiments of the disclosure.

Referring to FIG. 4A, an apparatus 100" is formed to include the active areas 104 and the STI structures 106 over the base material 102 (FIG. 1). A first insulative material 158 (e.g., an oxide material) may be formed over upper surfaces of the active areas 104 and the STI structures 106. A second insulative material 160 (e.g., a nitride material) may be formed over the first insulative material 158, and a third insulative material 162 (e.g., an additional oxide material) may be formed over the second insulative material 160. The first insulative material 158 is adjacent to (e.g., directly over) the active areas 104 and the STI structures 106, and is adjacent to the second insulative material 160. The third insulative material 162 is adjacent to (e.g., directly over) the second insulative material 160 such that the second insulative material 160 is directly between the first insulative material 158 and the third insulative material 162.

Openings 164 may be formed to extend through the first insulative material 158, the second insulative material 160, and the third insulative material 162 to expose upper surfaces of the active areas 104 and the STI structures 106. For example, the openings 164 may expose portions of the upper surface of the active areas 104 and adjacent portions of the upper surface of the STI structures 106 without being centered (e.g., laterally centered) over the active areas 104. Thus, the openings 164 are formed off center (e.g., laterally offset) from a lateral center of the active areas 104 such that portions of the active areas 104 are located under the first insulative material 158. Accordingly, the off-center position of the openings 164 results in an offset registration 166.

Figure 4B:
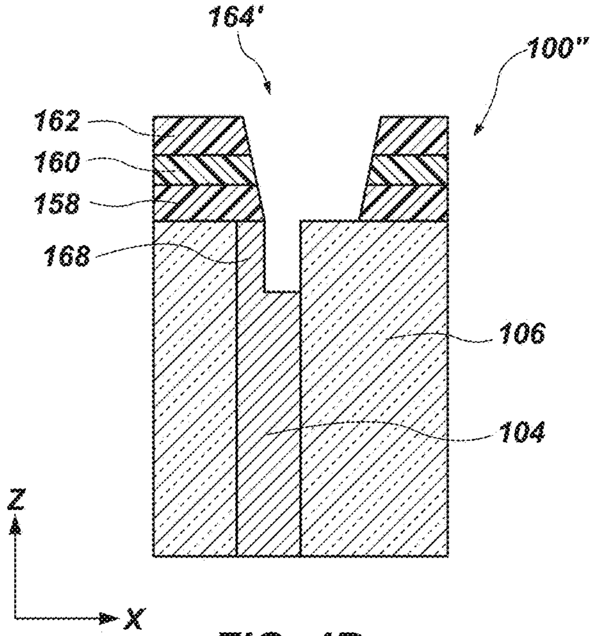

As shown in FIG. 4B, following formation of the openings 164 (FIG. 4A), sacrificial portions of a material of the active areas 104 may be removed (e.g., exhumed) to form extended openings 164' without substantially removing material from the STI structures 106. Formation of the extended openings 164' may result in remaining portions 168 of the active areas 104 underlying the first insulative material 158. The removal of the sacrificial portions of the material of the active areas 104 may be accomplished by any suitable technique including, but not limited to, one or more etching (e.g., dry etching, wet etching, vapor etching) processes.

Figure 4C:
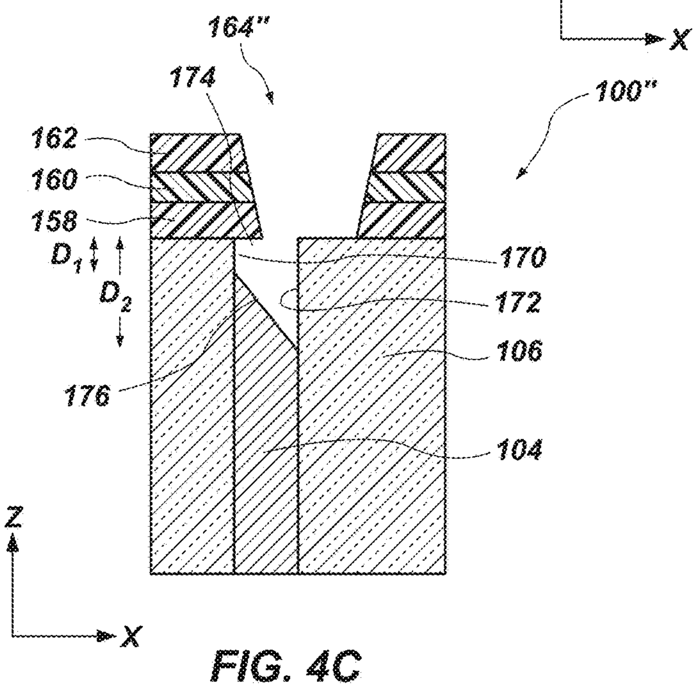
Figure 4D:
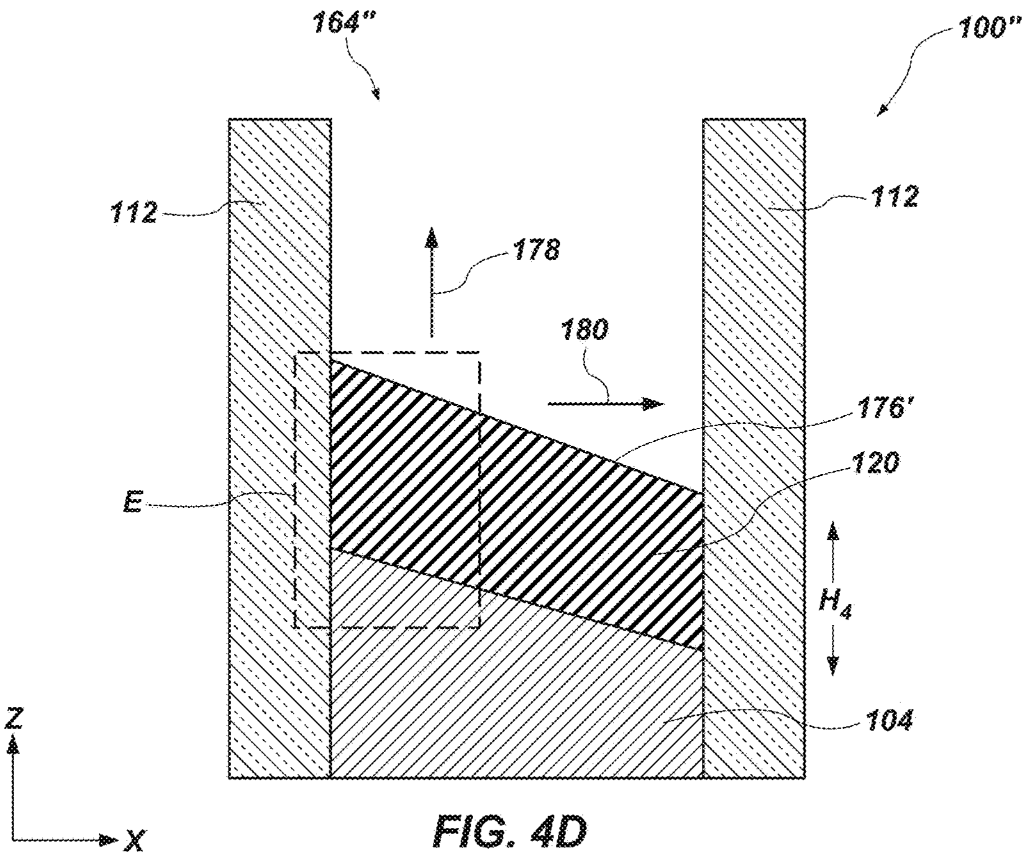
Figure 4E:
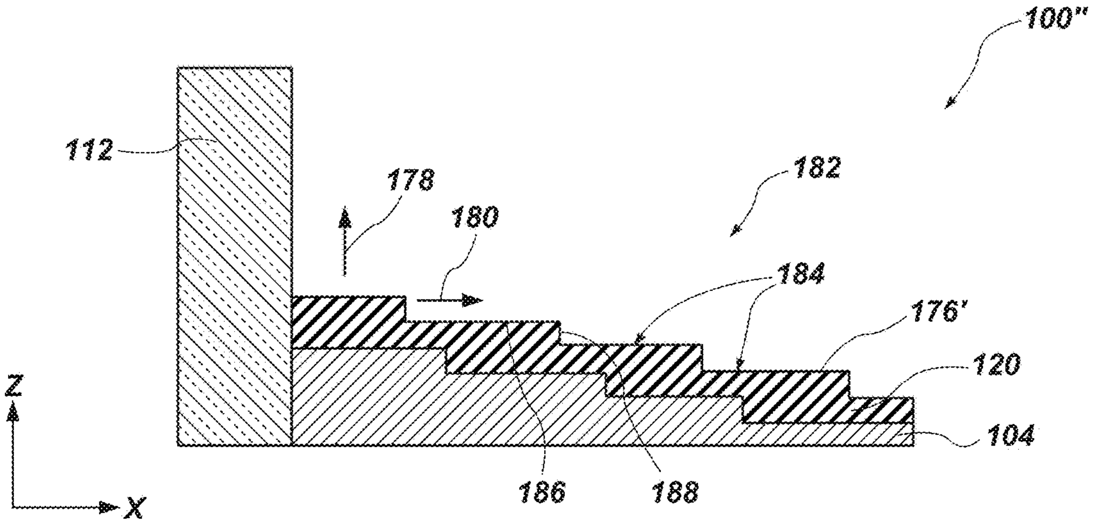

As shown in FIG. 4C, additional sacrificial portions of the material of the active areas 104 may be removed to form sloped openings 164". The additional sacrificial portions of the material of the active areas 104 may be removed during or after removal of the sacrificial portions thereof. For example, removal of the additional sacrificial portions of the material of the active areas 104 may be performed by etching exposed portions of the material of the active areas 104 in a directional material etch following formation of the extended openings 164' (FIG. 4B).

The sloped openings 164" may expose a first side surface 170 and a second side surface 172 of the STI structures 106. The second side surface 172 laterally opposes the first side surface 170. Formation of the sloped openings 164" may result in undercut regions 174 vertically underlying the first insulative material 158. The first side surface 170 of the STI structures 106 may be located under the first insulative material 158 (e.g., adjacent to the undercut regions 174). As shown in FIG. 4C, an upper surface 176 (e.g., a sloped upper surface) of the active area 104 adjacent to the first side surface 170 may be separated from the first insulative material 158 (e.g., from the upper surface of the STI structures 106) by a distance $D_1$ in the Z-direction, and the upper surface 176 of the active area 104 adjacent to the second side surface 172 may be separated from the upper surface of the STI structures 106 by a distance $D_2$ in the Z-direction. The distance $D_2$ adjacent to the second side surface 172 may be relatively greater than the distance $D_1$ adjacent to the first side surface 170. The upper surface 176 of the active area 104 exhibits a sloped configuration relative to the major surface of the base material 102 (FIG. 1). Accordingly, each of the first side surface 170 and the second side surface 172 of the STI structures 106 may be substantially orthogonal (e.g., perpendicular) to the major surface of the base material 102, and the upper surfaces 176 of the active areas 104 extend at an acute angle relative to the major surface of the base material 102. Thus, the upper surface 176 of the active area 104 extends at the acute angle relative to substantially straight, vertical walls of the insulative spacer material 112.

An additional material removal process (e.g., an isotropic vapor etch) may, optionally, be performed to lower the upper surface 176 of the active area 104 relative to the upper surfaces of the STI structures 106. For example, further sacrificial portions of the material of the active areas 104 may be removed to increase the distance $D_1$ and the distance $D_2$ by equal amounts between the upper surface 176 of the active area 104 and the upper surfaces of the STI structures 106. Accordingly, the active areas 104 individually exhibit a sloped cross-sectional profile. Dimensions of the sacrificial portions of the material of the active areas 104 removed during the one or more material removal processes may be selected at least partially based on height requirements of materials to be formed within remaining portions of the sloped openings 164".

Referring to FIG. 4D, formation of the monocrystalline semiconductor material 120 over the active areas 104 may result in an upper surface 176' (e.g., a sloped upper surface) of the monocrystalline semiconductor material 120. For clarity and case of understanding the drawings and associated description, surrounding materials, including the first insulative material 158, the second insulative material 160, and the third insulative material 162, are omitted in the simplified, partial cross-sectional views of FIGS. 4D through 4G. One or more (e.g., each) of the upper surface 176' and the lower surface of the monocrystalline semiconductor material 120 extends at an acute angle relative to side surfaces of the monocrystalline semiconductor material 120. Accordingly, the monocrystalline semiconductor material 120 of the apparatus 100" exhibits a sloped cross-sectional profile. The sloped cross-sectional profile of the monocrystalline semiconductor material 120 may be similar to the sloped cross-sectional profile of the active areas 104 (e.g., extend at a similar acute angle relative to the major surface of the base material 102 (FIG. 1)).

Formation of the active areas 104 exhibiting the sloped cross-sectional profile may facilitate formation of the monocrystalline semiconductor material 120 exhibiting the sloped cross-sectional profile, which may facilitate formation of additional material (e.g., additional monocrystalline material) in more than one direction (e.g., two directions) within the sloped openings 164". For example, the sloped cross-sectional profile of the monocrystalline semiconductor material 120 at the upper surface 176' thereof may facilitate formation of the additional material in the vertical direction (e.g., the Z-direction) as indicated by arrow 178 and in at least one horizontal direction (e.g., the X-direction) as indicated by arrow 180. The arrow 178 may be substantially aligned (e.g., in the Z-direction) with sidewalls of the insulative spacer material 112, and the arrow 180 may be substantially aligned (e.g., in the X-direction) with the major surface of the base material 102. Further, a direction of the arrow 178 may be orthogonal (e.g., perpendicular) to a direction of the arrow 180. Accordingly, the crystalline material of the monocrystalline semiconductor material 120 may exhibit the (100) silicon crystal orientation, as well as exhibiting a (001) silicon crystal orientation, without exhibiting the (111) silicon crystal orientation or a (110) silicon crystal orientation.

Figure 4F:
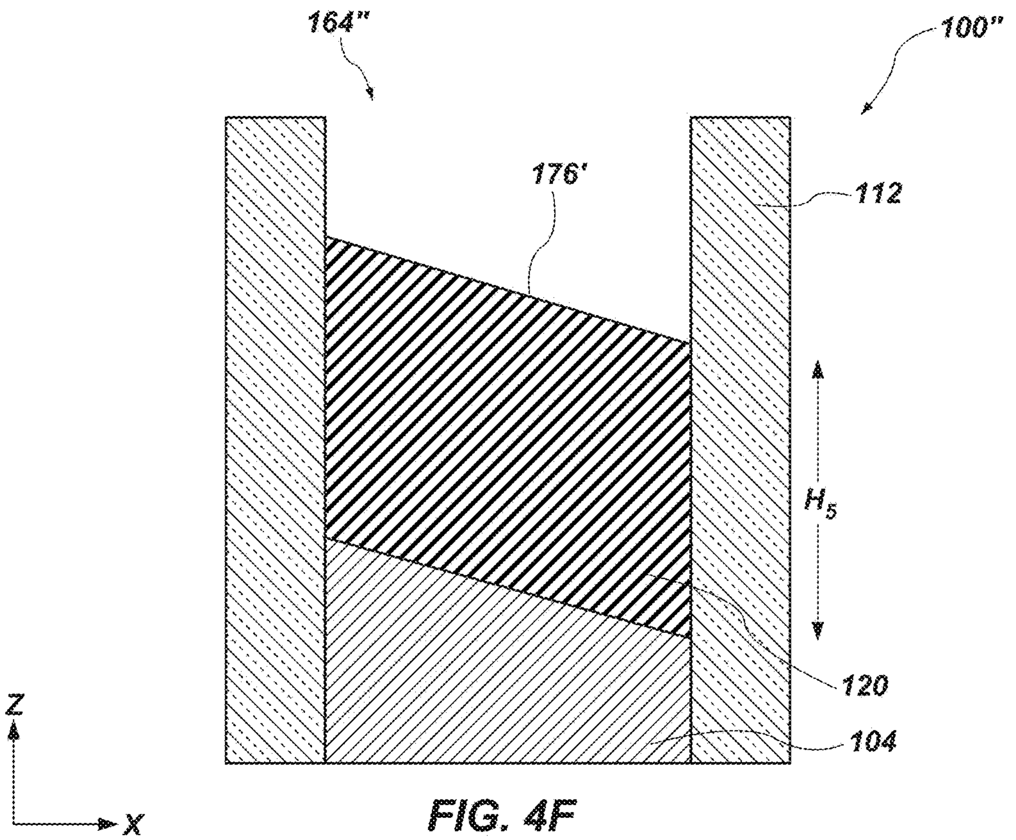
Figure 4G:
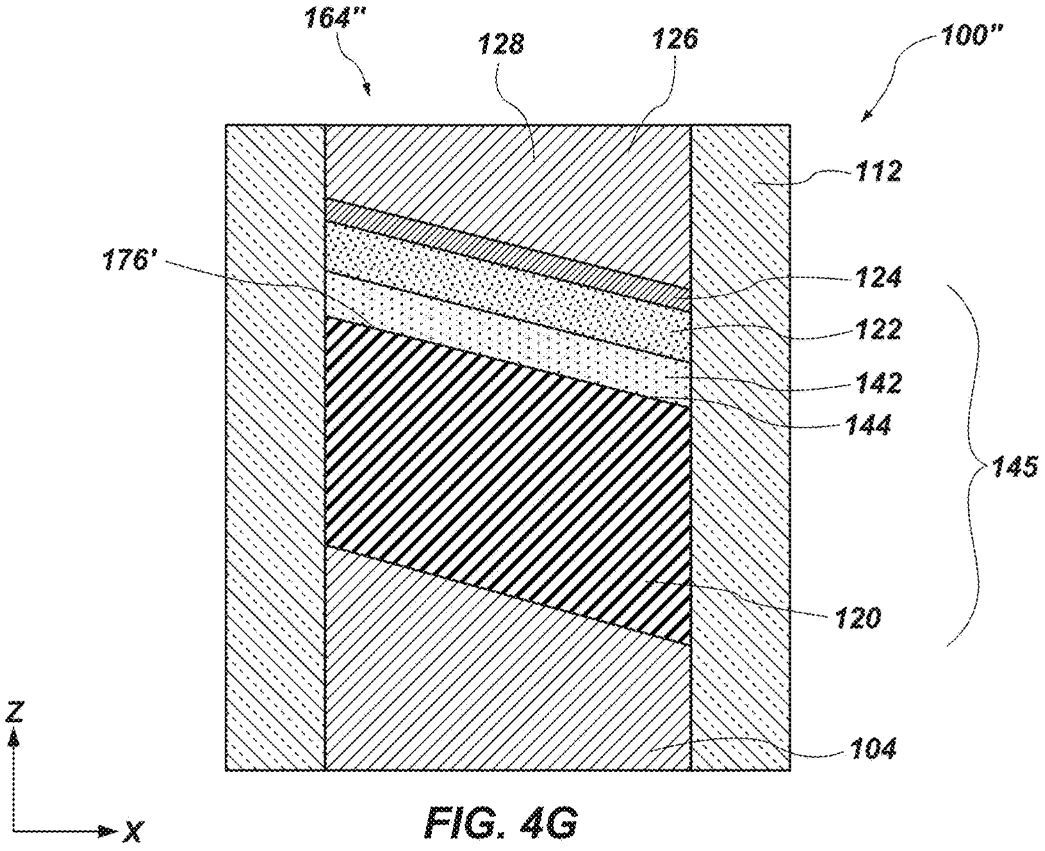

Formation of the additional material of the monocrystalline semiconductor material 120 may facilitate an increased height of the epitaxial plug 145 (FIG. 4G). The monocrystalline semiconductor material 120 of the apparatus 100", as initially formed, may exhibit a fourth height $H_4$. For example, the fourth height $H_4$ of the monocrystalline semiconductor material 120, as initially formed, may be within a range of from about 5 nm to about 15 nm (e.g., about 5 nm).

An enlarged portion of the sloped openings 164" including the upper surface 176' of the monocrystalline semiconductor material 120 is illustrated in FIG. 4E. For illustrative purposes, a thickness (e.g., the fourth height $H_4$) of the monocrystalline semiconductor material 120 in the enlarged view of FIG. 4E is less than that illustrated in FIG. 4D. However, the monocrystalline semiconductor material 120 is understood to include the fourth height $H_4$, as described with reference to FIG. 4D.

As shown in FIG. 4E, formation of the monocrystalline semiconductor material 120 including the upper surface 176' may result in formation of a stepped region 182 responsive to forming the sloped upper surface of the upper surface 176'. The stepped region 182 may include steps 184 comprising edges (e.g., horizontal ends) of portions of the monocrystalline semiconductor material 120. Accordingly, the monocrystalline semiconductor material 120 of the apparatus 100" at least partially defined by the stepped region 182 includes a stepped cross-sectional profile. The stepped cross-sectional profile of the monocrystalline semiconductor material 120 may be defined by the geometric configurations of the steps 184 of the stepped region 182 thereof. Lower boundaries of the sloped openings 164" (FIG. 4D) are defined by the steps 184 of the stepped region 182 at the processing stage depicted in FIG. 4E.

Since the arrow 178 is substantially aligned with sidewalls of the insulative spacer material 112 and the arrow 180 is substantially aligned with the major surface of the base material 102 (FIG. 1), the steps 184 may be formed at right angles (e.g., about 90-degree angles) to surrounding materials (e.g., the insulative spacer material 112, the base material 102), although other configurations may be contemplated.

Each of the steps 184 of the stepped region 182 may exhibit substantially the same horizontal width (e.g., tread) in the X-direction, or one or more of the steps 184 of the stepped region 182 may exhibit a different horizontal width than one or more other of the steps 184 of the stepped region 182 responsive to natural variation of crystalline structures of the monocrystalline semiconductor material 120. In addition, each of the steps 184 of the stepped region 182 may exhibit substantially the same vertical height (e.g., rise) in the Z-direction, or one or more of the steps 184 of the stepped region 182 may exhibit a different vertical height than one or more other of the steps 184 of the stepped region 182 responsive to the natural variation of the crystalline structures of the monocrystalline semiconductor material 120. For example, a horizontal width (e.g., tread length) of the steps 184 may be within a range of from about 5 nm to about 25 nm, such as from about 5 nm to about 10 nm, from about 10 nm to about 15 nm, from about 15 nm to about 20 nm, or from about 20 nm to about 25 nm, and a vertical height of the steps 184 may be within a range of from about 0.1 nm (1 angstrom (Å)) to about 5 nm, such as from about 0.1 nm to about 0.5 nm, from about 0.5 nm to about 1 nm, from about 1 nm to about 3 nm, or from about 3 nm to about 5 nm. However, the disclosure is not so limited and the horizontal width and the vertical height of the steps 184 may be different than those described above.

Formation of the stepped region 182 of the monocrystalline semiconductor material 120 may result in formation of first exposed regions 186 and second exposed regions 188. For example, the first exposed regions 186 may coincide with (e.g., define) horizontal surfaces of individual steps 184, and the second exposed regions 188 may coincide with (e.g., define) vertical surfaces of the individual steps 184. Accordingly, the upper surface 176' of the monocrystalline semiconductor material 120 may provide more than one (e.g., two) surfaces in the XZ plane, which may facilitate formation of additional material (e.g., additional monocrystalline material) of the monocrystalline semiconductor material 120 in more than one direction (e.g., two directions) within the sloped openings 164" of the apparatus 100". The monocrystalline semiconductor material 120 is directly adjacent to the individual steps 184 on two consecutive sides (e.g., a horizontal side and a vertical side) thereof. Accordingly, the crystalline material of the monocrystalline semiconductor material 120 may be formed to exhibit the (100) silicon crystal orientation and the (001) silicon crystal orientation.

As shown in FIG. 4F, upon additional processing of the apparatus 100", the monocrystalline semiconductor material 120 may exhibit a fifth height $H_5$ that is relatively greater than the fourth height $H_4$ of the monocrystalline semiconductor material 120, as initially formed. For example, the fifth height $H_5$ of the monocrystalline semiconductor material 120 may be within a range of from about 10 nm to about 35 nm (e.g., equal to or greater than about 15 nm). Further, the fifth height $H_5$ may be about three times (3×) greater than a height of conventional materials of conventional apparatus. However, the disclosure is not so limited and the fifth height $H_5$ may be different than those described above. Since the width $W_1$ (FIG. 1) of the openings 164 and, hence, a width of the monocrystalline semiconductor material 120 may be equal to or less than about 25 nm (e.g., about 10 nm, about 8 nm) and the fifth height $H_5$ of the monocrystalline semiconductor material 120 may be equal to or greater than about 15 nm, the fifth height $H_5$ (e.g., in the Z-direction) may be relatively greater than a width (e.g., in the X-direction) thereof. Forming the upper surface 176' of the monocrystalline semiconductor material 120 to exhibit the sloped cross-sectional profile may facilitate additional epitaxial growth of the monocrystalline semiconductor material 120 in more than one direction (e.g., two directions) without forming additional material thereover, which may reduce constraints imposed by the self-limiting process within the constrained regions (e.g., reduced dimensions) of the sloped openings 164". For example, forming the upper surface 176' including the stepped region 182 may facilitate growth of the monocrystalline semiconductor material 120 in at least one horizontal direction (e.g., the X-direction) in addition growth in the vertical direction (e.g., the Z-direction).

As shown in FIG. 4G, portions of the monocrystalline semiconductor material 120 may be converted to the amorphous material 142. In some embodiments, portions (e.g., upper portions) of the monocrystalline semiconductor material 120 may be converted to the amorphous material 142 and additional portions (e.g., lower portions) of the monocrystalline semiconductor material 120 may remain in the apparatus 100". In some such embodiments, the amorphous material 142 directly contacts the monocrystalline semiconductor material 120 along the interface 144 therebetween, and monocrystalline semiconductor material 120 is directly between the active areas 104 and the amorphous material 142. After forming the amorphous material 142, the metal silicide 122 may be formed within portions (e.g., upper portions, an entirety of) the amorphous material 142. The barrier material 124 may, optionally, be formed adjacent to (e.g., over) the metal silicide 122, resulting in formation of the epitaxial plug 145. The monocrystalline semiconductor material 120, the amorphous material 142, if present, the metal silicide 122, and the barrier material 124, if present, constitute the epitaxial plug 145. The metal material 126 may be formed over the barrier material 124 and adjacent portions of the insulative spacer material 112, resulting in formation of the cell contacts 128. Since the monocrystalline semiconductor material 120 exhibits the sloped cross-sectional profile at the upper surface 176' thereof, the materials (e.g., the amorphous material 142, the metal silicide 122, the barrier material 124) overlying the monocrystalline semiconductor material 120 may also exhibit a sloped cross-sectional profile such that lower surfaces of the metal material 126 of the cell contacts 128 exhibit a sloped cross-sectional profile, similar to the sloped cross-sectional profiles of the monocrystalline semiconductor material 120 and the active areas 104. Further, side surfaces (e.g., substantially vertical side surfaces) of the monocrystalline semiconductor material 120 may be laterally offset relative to side surfaces of the metal material 126 responsive to the offset registration 166 (FIG. 4A) of the openings 164 (FIG. 4A).

With the sloped cross-sectional profile, a larger amount of the monocrystalline semiconductor material 120 of the contact structures 130 (FIG. 1) may be available for formation of the metal silicide 122 thereover relative to the conventional contacts. By having an increased amount of the monocrystalline semiconductor material 120 of the epitaxial plug 145 in the contact structures 130 and having a larger amount of the amorphous material 142 available for the metal silicide 122 over the monocrystalline semiconductor material 120, the contact resistance of the apparatus 100" may be reduced. In particular, the monocrystalline semiconductor material 120 may be formed to facilitate formation of the crystalline material exhibiting the (100) silicon crystal orientation and the (001) silicon crystal orientation and to reduce (e.g., avoid) formation of one or more of the (111) silicon crystal orientation and the (110) silicon crystal orientation. By forming the monocrystalline semiconductor material 120 to exhibit the (100) silicon crystal orientation and the (001) silicon crystal orientation without exhibiting the (111) silicon crystal orientation or the (110) silicon crystal orientation, contact resistance may be further reduced. Formation of the monocrystalline semiconductor material 120 exhibiting the (100) silicon crystal orientation and the (001) silicon crystal orientation without exhibiting the (111) silicon crystal orientation or the (110) silicon crystal orientation may allow the crystalline material formed during the epitaxial growth process to be substantially free of facets at or proximal the upper surface 176 thereof.

Figure 5A:
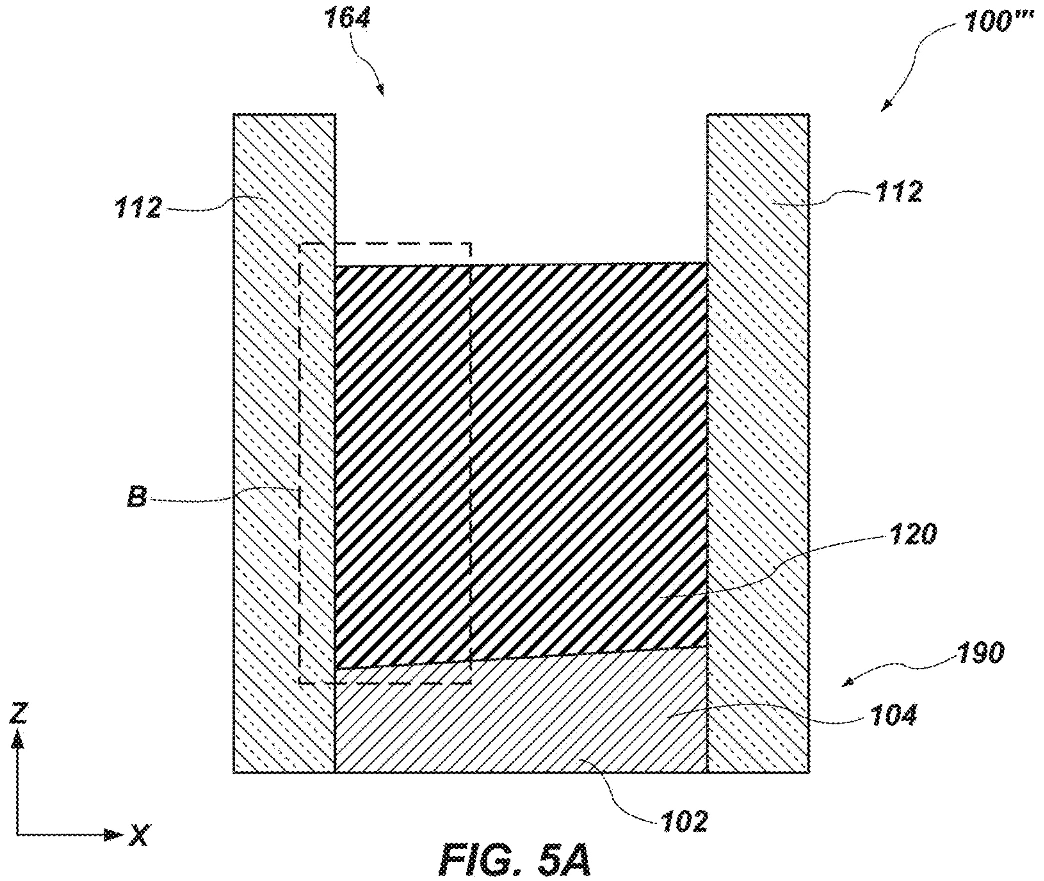
FIGS. 5A through 5D are simplified, partial cross-sectional views illustrating a method of forming the apparatus according to additional embodiments of the disclosure.
Figure 5B:
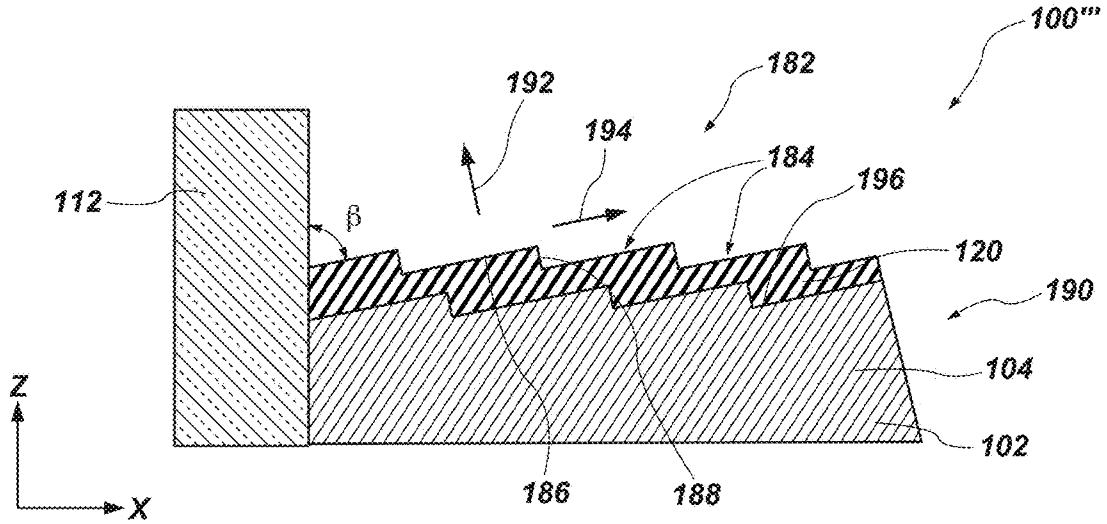

FIGS. 5A through 5D show simplified, partial cross-sectional views of a method of forming an apparatus having a different configuration than the apparatus 100". FIG. 5A illustrates a simplified, partial cross-sectional view of an apparatus 100'''. At the processing stage depicted in FIG. 5A the apparatus 100''' may be substantially similar to the apparatus 100" at the processing stage depicted in FIG. 4F, except that the base material 102 is inclined. FIG. 5B illustrates an enlarged portion of box B of FIG. 5A. The apparatus 100''' may include the active areas 104 formed in the base material 102 and the monocrystalline semiconductor material 120 formed over the active areas 104 within the openings 164 defined by sidewalls of the insulative spacer material 112. The apparatus 100''' may or may not include the offset registration 166 (FIG. 4A).

The apparatus 100''' may be formed to include an inclined (e.g., miscut) substrate of the base material 102, illustrated in FIG. 5A as an inclined base material 190. The inclined base material 190 may include a so-called "vicinal surface," as described below. For example, the substrate (e.g., a silicon substrate) of the base material 102 may be formed by intentionally fabricating (e.g., cutting) upper surfaces thereof at an angle relative to a major axis (e.g., a major horizontal axis) of the base material 102 to form the inclined base material 190. As used herein, the term "vicinal surface" means and includes a surface that is off-cut from conventional crystallographic planes. For example, the normal vector of a vicinal surface deviates from a major crystallographic axis. The vicinal surface may include a stepped region including vertical surfaces of steps separating horizontal surfaces thereof.

An enlarged portion of the openings 164 including the inclined base material 190 (e.g., the base material 102) is illustrated in FIG. 5B. For illustrative purposes, a thickness of the monocrystalline semiconductor material 120 in the enlarged view of FIG. 5B is less than that illustrated in FIG. 5A. However, the monocrystalline semiconductor material 120 is understood to include a full height, as shown in FIG. 5A.

Formation of the inclined base material 190 may facilitate formation of additional material (e.g., additional monocrystalline material) in at least one direction (e.g., the Z-direction) within the openings 164. In some embodiments, the inclined base material 190 may facilitate formation of the additional material in at least two directions (e.g., the Z-direction, the X-direction). For example, the inclined base material 190 may facilitate formation of the additional material in a first inclined direction as indicated by arrow 192 and in a second inclined direction as indicated by arrow 194. The arrow 192 may extend at an acute angle relative to substantially vertical sidewalls of the insulative spacer material 112 and substantially transverse (e.g., perpendicular) to the monocrystalline semiconductor material 120, and the arrow 194 may extend at another acute angle relative to the substantially vertical sidewalls of the insulative spacer material 112 and substantially parallel to the monocrystalline semiconductor material 120. Further, a direction of the arrow 192 may be orthogonal (e.g., perpendicular) to a direction of the arrow 194. The monocrystalline semiconductor material 120 may be formed to facilitate formation of the crystalline material exhibiting the (100) silicon crystal orientation, for example, and to reduce (e.g., avoid) formation of the (111) silicon crystal orientation or the (110) silicon crystal orientation. Formation of the inclined base material 190 may result in formation of additional material of the monocrystalline semiconductor material 120, which may facilitate an increased height of the epitaxial plug 145 (FIG. 5C) and reduced contact resistance.

An upper surface of the inclined base material 190 of the apparatus 100" may include a vicinal surface 196, as shown in FIG. 5B. The inclined base material 190 may exhibit an angle β (e.g., an acute angle) relative to the sidewalls (e.g., substantially vertical sidewalls) of the insulative spacer material 112. Accordingly, the inclined base material 190 extends at an acute angle relative to substantially vertical sidewalls of the monocrystalline semiconductor material 120. In some embodiments, one or more of the upper surface and the lower surface of the monocrystalline semiconductor material 120 may also exhibit the angle β relative to the sidewalls of the insulative spacer material 112 (e.g., relative to the substantially vertical sidewalls of the monocrystalline semiconductor material 120). The angle β of the upper surface and the lower surface of the monocrystalline semiconductor material 120 may be substantially similar to the angle β of the inclined base material 190.

By way of non-limiting example, the angle β defined by the intersection between vicinal surface 196 of the inclined base material 190 and the sidewalls of the insulative spacer material 112 and, thus, the angle β of the inclined base material 190 may be less than or equal to about 7 degrees, such as from about 1 degree to about 3 degrees, from about 3 degrees to about 5 degrees, or from about 5 degrees to about 7 degrees. In some embodiments, the angle β is about 1 degree. In other embodiments, the angle β is about 5 degrees to about 7 degrees. However, the disclosure is not so limited and the angle β may be different than those described above. For clarity and ease of understanding the drawings and associated descriptions, the angle β of the inclined base material 190 may appear greater than the disclosed ranges. The angle β may be selected and tailored to facilitate a reduced thickness of the metal silicide 122 (FIG. 5C) formed during the implant process, while maintaining a thickness (e.g., the fifth height $H_5$ (FIG. 5C)) of the monocrystalline semiconductor material 120 for reduced contact resistance.

As shown in FIG. 5B, formation of the monocrystalline semiconductor material 120 may result in formation of the stepped region 182 including the steps 184 comprising edges (e.g., horizontal ends) of portions of the monocrystalline semiconductor material 120. Accordingly, the monocrystalline semiconductor material 120 of the apparatus 100'" at least partially defined by the stepped region 182 includes a stepped cross-sectional profile. The stepped cross-sectional profile of the monocrystalline semiconductor material 120 may be defined by the geometric configurations of the steps 184 of the stepped region 182 thereof. Lower boundaries of the openings 164 (FIG. 5A) are defined by the steps 184 of the stepped region 182 at the processing stage depicted in FIG. 5B.

Since the arrow 192 and the arrow 194 extend at an acute angle relative to the sidewalls of the insulative spacer material 112 and the direction of the arrow 192 is orthogonal (e.g., perpendicular) to a direction of the arrow 194, the steps 184 may be formed at right angles (e.g., substantially 90-degree angles) to one another and extend at acute angles relative to the surrounding materials (e.g., the insulative spacer material 112), although other configurations may be contemplated. Each of the steps 184 of the stepped region 182 may exhibit substantially the same horizontal width in the X-direction, or one or more of the steps 184 of the stepped region 182 may exhibit a different horizontal width than one or more other of the steps 184 of the stepped region 182 responsive to natural variation of crystalline structures of the monocrystalline semiconductor material 120, as described with reference to FIG. 4E.

Formation of the stepped region 182 of the monocrystalline semiconductor material 120 may result in formation of the first exposed regions 186 and the second exposed regions 188. For example, the first exposed regions 186 may coincide with (e.g., define) inclined horizontal surfaces of individual steps 184, and the second exposed regions 188 may coincide with (e.g., define) inclined vertical surfaces of the individual steps 184. Accordingly, the vicinal surface 196 of the inclined base material 190 may provide more than one (e.g., two) surfaces in the XZ plane, which may facilitate formation of additional material (e.g., additional monocrystalline material) of the monocrystalline semiconductor material 120 in at least one direction (e.g., two directions) within the openings 164 of the apparatus 100'". The additional material of the monocrystalline semiconductor material 120 may increase the height of the resulting epitaxial plug 145, which is due to the formation of the additional material in the directions of arrows 192, 194. The additional material may be simultaneously grown in the directions of arrows 192, 194 at substantially the same rate.

Figure 5C:
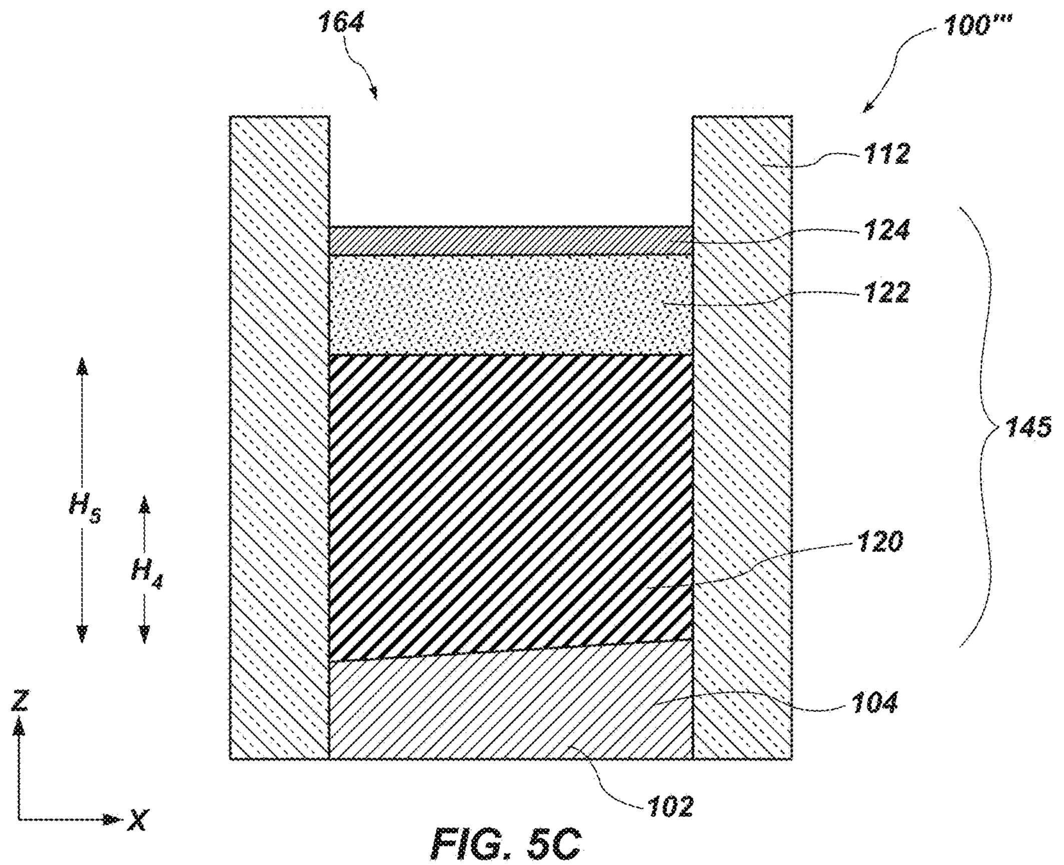

As shown in FIG. 5C, the metal silicide 122 may be formed adjacent to (e.g., over) the monocrystalline semiconductor material 120. For example, portions of the monocrystalline semiconductor material 120 may be converted to the amorphous material 142 (FIG. 4G). Portions of the amorphous material 142 may or may not remain in the apparatus 100'". In some embodiments, the metal silicide 122 directly contacts the monocrystalline semiconductor material 120, and monocrystalline semiconductor material 120 is directly between the active areas 104 and the metal silicide 122. The barrier material 124 may, optionally, be formed adjacent to (e.g., over) the metal silicide 122, resulting in formation of the epitaxial plug 145.

In some embodiments, the monocrystalline semiconductor material 120 of the apparatus 100'" exhibits a sloped cross-sectional profile, similar to the sloped cross-sectional profile of the inclined base material 190. One or more (e.g., each) of the vicinal surface 196 of the inclined base material 190 and the upper surface of the monocrystalline semiconductor material 120 extends at an acute angle relative to side surfaces of the monocrystalline semiconductor material 120. In other embodiments, the upper surface of the monocrystalline semiconductor material 120 exhibits a substantially horizontal cross-sectional profile, as shown in FIG. 5C, responsive to growth of crystalline structures of the monocrystalline semiconductor material 120 exhibiting the (100) silicon crystal orientation. In some such embodiments, the metal silicide 122 and the barrier material 124 exhibits a substantially horizontal cross-sectional profile, similar to the substantially horizontal cross-sectional profile of the monocrystalline semiconductor material 120. Formation of the monocrystalline semiconductor material 120 exhibiting the (100) silicon crystal orientation without exhibiting the (111) silicon crystal orientation or the (110) silicon crystal orientation may allow the crystalline material formed during the epitaxial growth process to be substantially free of facets at or proximal the upper surface thereof.

As shown in FIG. 5C, the monocrystalline semiconductor material 120 of the apparatus 100''', as initially formed, may exhibit the fourth height $H_4$. For example, the fourth height $H_4$ of the monocrystalline semiconductor material 120, as initially formed, may be within a range of from about 5 nm to about 15 nm (e.g., about 5 nm). Upon additional processing of the apparatus 100'', the monocrystalline semiconductor material 120 may exhibit the fifth height $H_5$ that is relatively greater than the fourth height $H_4$ of the monocrystalline semiconductor material 120, as initially formed. For example, the fifth height $H_5$ of the monocrystalline semiconductor material 120 may be within a range of from about 10 nm to about 35 nm (e.g., equal to or greater than about 15 nm). Further, the fifth height $H_5$ may be about three times (3×) greater than a height of conventional materials of conventional apparatus. However, the disclosure is not so limited and the fifth height $H_5$ may be different than those described above.

Since the width $W_1$ (FIG. 1) of the openings 164 and, hence, a width of the monocrystalline semiconductor material 120 may be equal to or less than about 25 nm (e.g., about 10 nm, about 8 nm) and the fifth height $H_5$ of the monocrystalline semiconductor material 120 may be equal to or greater than about 15 nm, the fifth height $H_5$ (e.g., in the Z-direction) may be relatively greater than a width (e.g., in the X-direction) thereof. Forming the inclined base material 190 to exhibit the angle β may facilitate additional epitaxial growth of the monocrystalline semiconductor material 120 over the vicinal surface 196 of the inclined base material 190 in at least one direction without forming additional material thereover, which may reduce constraints imposed by the self-limiting process within the constrained regions (e.g., reduced dimensions) of the openings 164.

Figure 5D:
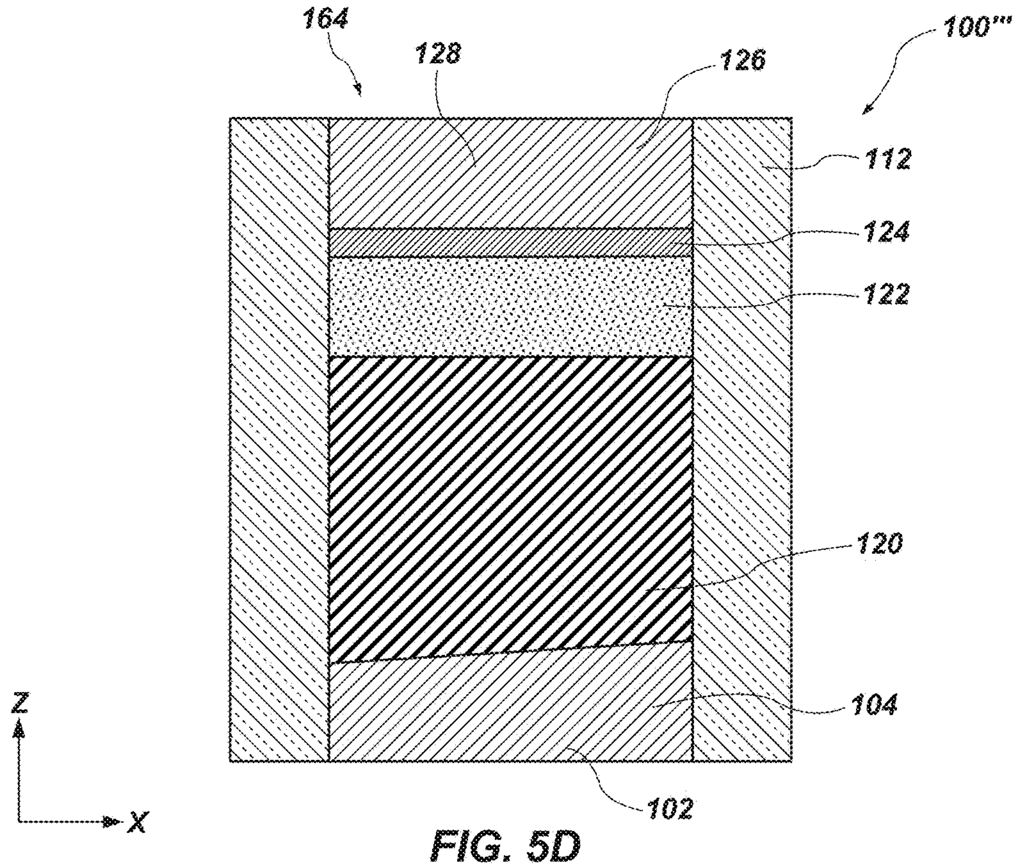

As shown in FIG. 5D, the metal material 126 may be formed over the barrier material 124 and adjacent portions of the insulative spacer material 112, resulting in formation of the cell contacts 128. A larger amount of the monocrystalline semiconductor material 120 of the contact structures 130 (FIG. 1) may be available for formation of the metal silicide 122 thereover relative to the conventional contacts. By having an increased amount of the monocrystalline semiconductor material 120 of the epitaxial plug 145 in the contact structures 130, the contact resistance of the apparatus 100''' may be reduced. By forming the monocrystalline semiconductor material 120 to exhibit the (100) silicon crystal orientation without exhibiting the (111) silicon crystal orientation or the (110) silicon crystal orientation, contact resistance may be further reduced.

For clarity and ease of understanding the drawings and associated descriptions, the individual embodiments of the apparatus 100, 100', 100'', 100''' are illustrated and described separately. However, it is understood that two or more embodiments may be combined. For example, the apparatus 100 may additionally be formed to include one or more of the upper surface 176 of the active areas 104 of the embodiment of the apparatus 100'' and the vicinal surface 196 of the inclined base material 190 of the apparatus 100'''. Additional combined embodiments may be contemplated to facilitate formation of the additional material of the monocrystalline semiconductor material 120 and to facilitate an increased height of the epitaxial plug 145.

Accordingly, an apparatus comprising a memory array is disclosed. The memory array comprises access lines, digit lines, and memory cells. Each memory cell is coupled to an associated access line and an associated digit line and each memory cell comprises an access device, and a monocrystalline semiconductor material adjacent to the access device. A width of the monocrystalline semiconductor material is within a range of from about 8 nm to about 25 nm. Each memory cell comprises a metal silicide material over the monocrystalline semiconductor material, a metal contact material over the metal silicide material, and a storage node adjacent to the metal contact material.

Accordingly, a method of forming an apparatus is disclosed. The method comprises forming a monocrystalline semiconductor material adjacent to active areas of memory cells by selective epitaxy. A width of the monocrystalline semiconductor material is within a range of from about 8 nm to about 25 nm. The method comprises forming an amorphous material over the monocrystalline semiconductor material, forming a metal material over the amorphous material, converting a portion of the amorphous material and the metal material to form a metal silicide material, forming a metal contact material over the metal silicide material, and forming a storage node adjacent to the metal contact material.

Although one or more of the apparatus 100, 100', 100'', 100''' are described herein as including a memory device including a memory array of a dynamic random access memory (DRAM) device, the disclosure is not so limited. By way of non-limiting example, the apparatus 100 may be used within additional memory devices including FLASH memory configured as a not-and (NAND), not-or (NOR), 3D XPoint memory devices, or other memory devices. Such configurations may facilitate a higher density of the memory array relative to conventional memory devices.

Figure 6:
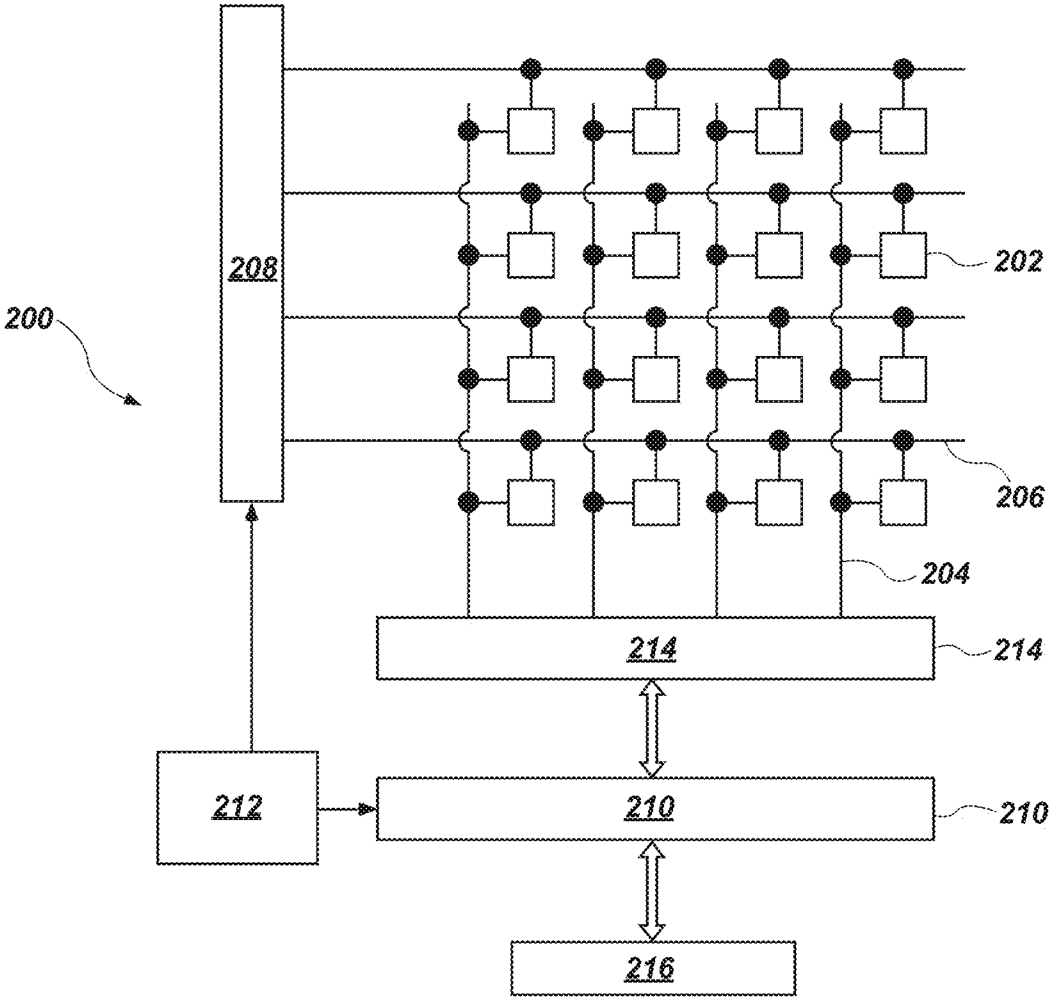
FIG. 6 is a functional block diagram of an electronic device in accordance with embodiments of the disclosure.

The apparatus 100 may be subjected to additional processing acts, as desired, to form an electronic device 200 (e.g., a memory device) including the apparatus 100, 100', 100'', 100''', as shown in FIG. 6. Such additional processing may employ conventional processes and conventional processing equipment. The electronic device 200 may include, for example, embodiments of the apparatus 100, 100', 100'', 100''' previously described herein. As shown in FIG. 6, the electronic device 200 may include memory cells 202, digit lines 204 (e.g., bit lines), word lines 206 (e.g., access lines), a row decoder 208, a column decoder 210, a memory controller 212, a sense device 214, and an input/output device 216.

The memory cells 202 of the electronic device 200 are programmable to at least two different logic states (e.g., logic 0 and logic 1). Each memory cell 202 may individually include a capacitor and transistor (not shown) and the contact structure 130 (FIG. 1) according to embodiments of the disclosure. The capacitor stores a charge representative of the programmable logic state (e.g., a charged capacitor may represent a first logic state, such as a logic 1; and an uncharged capacitor may represent a second logic state, such as a logic 0) of the memory cell 202. The transistor grants access to the capacitor upon application (e.g., by way of one of the word lines 206) of a minimum threshold voltage to a semiconductive channel thereof for operations (e.g., reading, writing, rewriting) on the capacitor.

The digit lines 204 are connected to the capacitors of the memory cells 202 by way of the transistors of the memory cells 202. The word lines 206 extend perpendicular to the digit lines 204, and are connected to gates of the transistors of the memory cells 202. Operations may be performed on the memory cells 202 by activating appropriate digit lines 204 and word lines 206. Activating a digit line 204 or a word line 206 may include applying a voltage potential to the digit line 204 or the word line 206. Each column of memory cells 202 may individually be connected to one of the digit lines 204, and each row of the memory cells 202 may individually be connected to one of the word lines 206. Individual memory cells 202 may be addressed and accessed through the intersections (e.g., cross points) of the digit lines 204 and the word lines 206.

The memory controller 212 may control the operations of the memory cells 202 through various components, including the row decoder 208, the column decoder 210, and the sense device 214. The memory controller 212 may generate row address signals that are directed to the row decoder 208 to activate (e.g., apply a voltage potential to) predetermined word lines 206, and may generate column address signals that are directed to the column decoder 210 to activate (e.g., apply a voltage potential to) predetermined digit lines 204. The memory controller 212 may also generate and control various voltage potentials employed during the operation of the electronic device 200. In general, the amplitude, shape, and/or duration of an applied voltage may be adjusted (e.g., varied), and may be different for various operations of the electronic device 200.

During use and operation of the electronic device 200, after being accessed, a memory cell 202 may be read (e.g., sensed) by the sense device 214. The sense device 214 may compare a signal (e.g., a voltage) of an appropriate digit line 204 to a reference signal in order to determine the logic state of the memory cell 202. If, for example, the digit line 204 has a higher voltage than the reference voltage, the sense device 214 may determine that the stored logic state of the memory cell 202 is a logic 1, and vice versa. The sense device 214 may include transistors and amplifiers to detect and amplify a difference in the signals. The detected logic state of a memory cell 202 may be output through the column decoder 210 to the input/output device 216. In addition, a memory cell 202 may be set (e.g., written) by similarly activating an appropriate word line 206 and an appropriate digit line 204 of the electronic device 200. By controlling the digit line 204 while the word line 206 is activated, the memory cell 202 may be set (e.g., a logic value may be stored in the memory cell 202). The column decoder 210 may accept data from the input/output device 216 to be written to the memory cells 202. Furthermore, a memory cell 202 may also be refreshed (e.g., recharged) by reading the memory cell 202. The read operation will place the contents of the memory cell 202 on the appropriate digit line 204, which is then pulled up to full level (e.g., full charge or discharge) by the sense device 214. When the word line 206 associated with the memory cell 202 is deactivated, all of memory cells 202 in the row associated with the word line 206 are restored to full charge or discharge.

Figure 7:
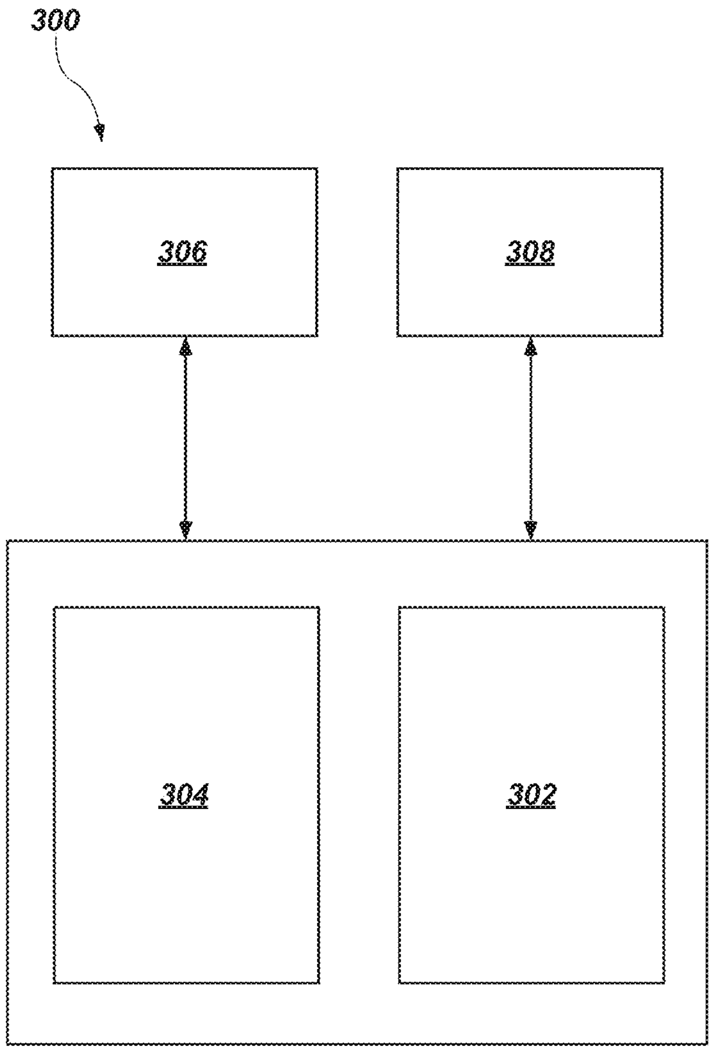
FIG. 7 is a schematic block diagram of an electronic system in accordance with embodiments of the disclosure.

The apparatus 100, 100', 100", 100'" according to embodiments of the disclosure may be used in embodiments of electronic systems of the disclosure. For example, FIG. 7 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one electronic device 200. The electronic device 200 may comprise, for example, an embodiment of one or more of the apparatus 100, 100', 100", 100'" previously described herein. The electronic system 300 may further include at least one electronic signal processor device 304 (often referred to as a "microprocessor"). The electronic signal processor device 304 may, optionally, include an embodiment of the apparatus 100, 100', 100", 100'" previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the electronic device 302 and the electronic signal processor device 304.

Accordingly, a system is disclosed and comprises a processor operably coupled to an input device and an output device, and electronic devices operably coupled to the processor. The electronic devices comprise memory cells coupled to associated word lines and to associated digit lines. Each of the memory cells comprises contact structures comprising a monocrystalline semiconductor material on active areas of the memory cells. One or more of upper surfaces and lower surfaces of the monocrystalline semiconductor material extend at an acute angle relative to side surfaces of the monocrystalline semiconductor material. The contact structures comprise a metal silicide material over the monocrystalline semiconductor material, and a metal contact material over the metal silicide material.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. An apparatus, comprising:

a memory array comprising access lines, digit lines, and memory cells, each memory cell coupled to an associated access line and an associated digit line and each memory cell comprising:

an access device;

a monocrystalline semiconductor material adjacent to the access device, a width of the monocrystalline semiconductor material within a range of from about 8 nm to about 25 nm;

a metal silicide material over the monocrystalline semiconductor material;

a metal contact material over the metal silicide material; and a storage node adjacent to the metal contact material.

2. The apparatus of claim 1, further comprising a nanocrystalline material between the monocrystalline semiconductor material and the metal silicide material, wherein the nanocrystalline material comprises one or more of amorphous regions and defect regions within boundaries of the nanocrystalline material.

3. The apparatus of claim 2, wherein a concentration of dopant atoms of an n-type dopant within the nanocrystalline material is within a range of from about 3 atomic percent to about 6 atomic percent, the concentration of the dopant atoms substantially homogenous throughout the nanocrystalline material.

4. The apparatus of claim 1, wherein an epitaxial plug comprises the monocrystalline semiconductor material and the metal silicide material, a width of the epitaxial plug within a range of from about 8 nm to about 10 nm, and a height of the epitaxial plug within a range of from about 15 nm to about 65 nm.

5. The apparatus of claim 1, further comprising opposing portions of an insulative spacer material laterally adjacent to the monocrystalline semiconductor material and the metal silicide material, the insulative spacer material comprising substantially straight, vertical sidewalls without voids therein.

6. The apparatus of claim 1, further comprising an amorphous material directly between the metal silicide material and the monocrystalline semiconductor material, the amorphous material and the metal silicide material lacking polycrystalline silicon.

7. The apparatus of claim 1, wherein:

the monocrystalline semiconductor material comprises a phosphorus-doped monocrystalline silicon material; and the monocrystalline semiconductor material lacks germanium and arsenic.

8. The apparatus of claim 1, wherein the access device comprises an active area adjacent to the monocrystalline semiconductor material, upper surfaces of the active area comprising a stepped region, the monocrystalline semiconductor material vertically and horizontally adjacent to individual steps at different elevations of the stepped region.

9. The apparatus of claim 1, wherein an upper surface of the access device extends at an acute angle relative to substantially vertical sidewalls of the monocrystalline semiconductor material, upper surfaces of the monocrystalline semiconductor material substantially free of facets.

10. A method of forming an apparatus, the method comprising:

forming a monocrystalline semiconductor material adjacent to active areas of memory cells by selective epitaxy, a width of the monocrystalline semiconductor material within a range of from about 8 nm to about 25 nm;

forming an amorphous material over the monocrystalline semiconductor material;

forming a metal material over the amorphous material;

converting a portion of the amorphous material and the metal material to form a metal silicide material;

forming a metal contact material over the metal silicide material; and forming a storage node adjacent to the metal contact material.

11. The method of claim 10, wherein forming the amorphous material comprises forming a phosphorus-doped amorphous material by substantially converting a sacrificial nanocrystalline material overlying a phosphorus-doped monocrystalline silicon material using a pre-amorphization implant process.

12. The method of claim 10, wherein forming the amorphous material comprises forming an n-doped amorphous silicon material over the monocrystalline semiconductor material in a single, substantially continuous process, without using an implant process.

13. The method of claim 10, further comprising forming one or more of a nanocrystalline material and a semi-crystalline material over the monocrystalline semiconductor material by selective epitaxy, the monocrystalline semiconductor material formed over the active areas of the memory cells and the one or more of the nanocrystalline material and the semi-crystalline material formed over the monocrystalline semiconductor material in a single, substantially continuous process.

14. The method of claim 13, wherein forming the nanocrystalline material comprises forming a nanocrystalline silicon material exhibiting a (111) silicon crystal orientation directly adjacent to the monocrystalline semiconductor material exhibiting a (100) silicon crystal orientation, without forming a polycrystalline material.

15. The method of claim 13, further comprising forming one or more of localized defect regions and amorphous regions within boundaries of the nanocrystalline material and thereafter forming the amorphous material within upper portions of the nanocrystalline material.

16. The method of claim 10, wherein forming the monocrystalline semiconductor material comprises:

forming openings over portions of the active areas of the memory cells and over portions of an insulative material laterally adjacent to the active areas;

removing portions of the active areas to form inclined upper surfaces; and selectively epitaxially growing the monocrystalline semiconductor material directly on the inclined upper surfaces of the active areas, epitaxial growth of the monocrystalline semiconductor material extending from the active areas in a vertical direction and at least one horizontal direction.

17. A system, comprising:

a processor operably coupled to an input device and an output device; and electronic devices operably coupled to the processor, the electronic devices comprising:

memory cells coupled to associated access lines and to associated digit lines, each of the memory cells comprising contact structures comprising:

a monocrystalline semiconductor material on active areas of the memory cells, one or more of upper surfaces and lower surfaces of the monocrystalline semiconductor material extending at an acute angle relative to substantially vertical side surfaces of the monocrystalline semiconductor material;

a metal silicide material over the monocrystalline semiconductor material; and a metal contact material over the metal silicide material.

18. The system of claim 17, wherein the contact structures comprise an offset registration comprising the substantially vertical side surfaces of the monocrystalline semiconductor material laterally offset relative to side surfaces of the metal contact material.

19. The system of claim 17, wherein upper surfaces of the active areas comprise a stepped region comprising individual steps, the monocrystalline semiconductor material directly adjacent to the individual steps on two consecutive sides of the individual steps.

20. The system of claim 17, further comprising:

an insulative spacer material laterally adjacent to the monocrystalline semiconductor material and the metal silicide material; and a base material comprising the active areas of the memory cells extending at an acute angle relative to substantially straight, vertical sidewalls of the insulative spacer material.

* * * * *